(12) United States Patent
Pierer et al.

(10) Patent No.: US 11,668,927 B2
(45) Date of Patent: Jun. 6, 2023

(54) WAVELENGTH STABILIZATION OF LASER DIODES BY TEMPERATURE CONTROL

(71) Applicant: GOOGLE LLC, Mountain View, CA (US)

(72) Inventors: Jörg Pierer, Alpnach (CH); Rony Jose James, Alpnach (CH); Stefan Mohrdiek, Affoltern am Albis (CH); Douglas R. Dykaar, Waterloo (CA); John Domm, Kitchener (CA)

(73) Assignee: GOOGLE LLC, Mountain View, CA (US)

( * ) Notice: Subject to any disclaimer, the term of this patent is extended or adjusted under 35 U.S.C. 154(b) by 1171 days.

(21) Appl. No.: 16/254,912

(22) Filed: Jan. 23, 2019

(65) Prior Publication Data

US 2019/0229495 A1 Jul. 25, 2019

Related U.S. Application Data

(60) Provisional application No. 62/760,835, filed on Nov. 13, 2018, provisional application No. 62/620,600, filed on Jan. 23, 2018.

(51) Int. Cl.
*G02B 26/10* (2006.01)
*H01S 5/068* (2006.01)
(Continued)

(52) U.S. Cl.
CPC .......... *G02B 26/101* (2013.01); *G02B 26/10* (2013.01); *G02B 27/01* (2013.01);
(Continued)

(58) Field of Classification Search
CPC .. G02B 27/01; G02B 27/017; G02B 27/0101; G02B 27/0172; H01S 5/02453; H01S 5/06804

See application file for complete search history.

(56) References Cited

U.S. PATENT DOCUMENTS

| 6,363,095 B1* | 3/2002 | Jones | ..................... H01S 3/0941 |
| | | | 372/75 |
| 2004/0240800 A1* | 12/2004 | Uchida | ................ G02B 6/4201 |
| | | | 385/92 |

(Continued)

FOREIGN PATENT DOCUMENTS

CN 204496106 U 7/2015

OTHER PUBLICATIONS

International Search Report and Written Opinion of the International Searching Authority, PCT/CA2018/051344, dated Feb. 19, 2019.

*Primary Examiner* — Yuzhen Shen

(57) ABSTRACT

Systems, devices, and methods for providing optical engines and laser projectors that are well-suited for use in wearable heads-up displays (WHUDs) are described. The optical engines of the present disclosure may integrate a plurality of laser diodes (e.g., 3 laser diodes, 4 laser diodes) within a single, hermetically or partially hermetically sealed, encapsulated package. Wavelength stabilization for the laser diodes is achieved by controlling the temperature of the lasers to always be in a particular range of operating specifications which provides wavelength stabilization that meets particular performance criteria. The lasers themselves may be used for temperature control by selectively switching them on to maintain their temperature within a specified range. Alternatively, compact resistive heaters may be positioned proximate the laser diodes to control the temperature of the laser diodes during operation. WHUDs that employ such optical engines and laser projectors are also described. Additionally, optical systems for collimating and shifting light beams are described.

12 Claims, 16 Drawing Sheets

(51) Int. Cl.
   *G02B 27/01*      (2006.01)
   *H01S 5/00*       (2006.01)
   *H01S 5/40*       (2006.01)
   *H01S 5/024*      (2006.01)
   *G02B 27/10*      (2006.01)
   *H01S 5/02253*    (2021.01)
   *H01S 5/02257*    (2021.01)
   *H01S 5/02325*    (2021.01)
   *G02B 27/42*      (2006.01)
   *G02B 27/00*      (2006.01)
   *H01S 5/0237*     (2021.01)

(52) U.S. Cl.
   CPC ....... *G02B 27/0101* (2013.01); *G02B 27/017* (2013.01); *G02B 27/0172* (2013.01); *G02B 27/1086* (2013.01); *H01S 5/0071* (2013.01); *H01S 5/02253* (2021.01); *H01S 5/02257* (2021.01); *H01S 5/02325* (2021.01); *H01S 5/02453* (2013.01); *H01S 5/06804* (2013.01); *H01S 5/4012* (2013.01); *H01S 5/4093* (2013.01); *G02B 27/0093* (2013.01); *G02B 27/4205* (2013.01); *G02B 2027/0178* (2013.01); *H01S 5/005* (2013.01); *H01S 5/0237* (2021.01)

(56) References Cited

U.S. PATENT DOCUMENTS

| | | |
|---|---|---|
| 2006/0138239 A1 | 6/2006 | Sonoda et al. |
| 2007/0200064 A1* | 8/2007 | Remillard .............. G02B 23/12 250/330 |
| 2009/0103574 A1* | 4/2009 | Park ........................ H01S 3/025 372/4 |
| 2011/0063871 A1 | 3/2011 | Tanaka et al. |
| 2012/0099170 A1* | 4/2012 | Shikii ................... H04N 9/3161 359/13 |
| 2012/0188623 A1* | 7/2012 | Inoue .................... G02B 26/101 359/197.1 |
| 2013/0114629 A1 | 5/2013 | Firth et al. |
| 2013/0265770 A1 | 10/2013 | Breidenassel et al. |
| 2014/0126918 A1 | 5/2014 | Sato |
| 2014/0240952 A1 | 8/2014 | Nakanishi et al. |
| 2015/0229897 A1* | 8/2015 | Mukawa ............... G02B 27/017 345/593 |
| 2016/0041396 A1* | 2/2016 | Kawamura ........ G02B 27/0172 345/8 |
| 2016/0189741 A1* | 6/2016 | Tatah ..................... G11B 5/02 369/13.26 |
| 2017/0299956 A1 | 10/2017 | Holland et al. |
| 2019/0018239 A1* | 1/2019 | Kurozuka ........... G02B 27/141 |
| 2019/0157839 A1* | 5/2019 | Gudaitis .............. H01S 5/0683 |

\* cited by examiner

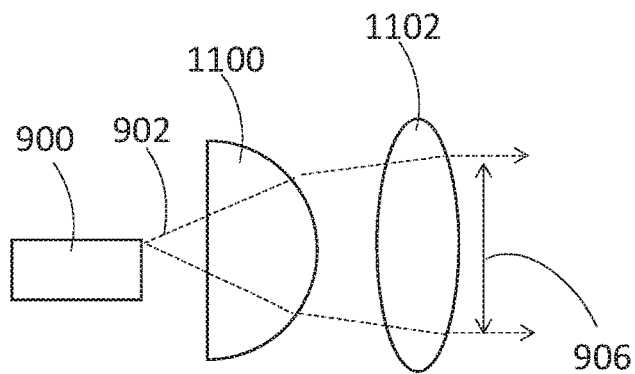
FIG. 11A
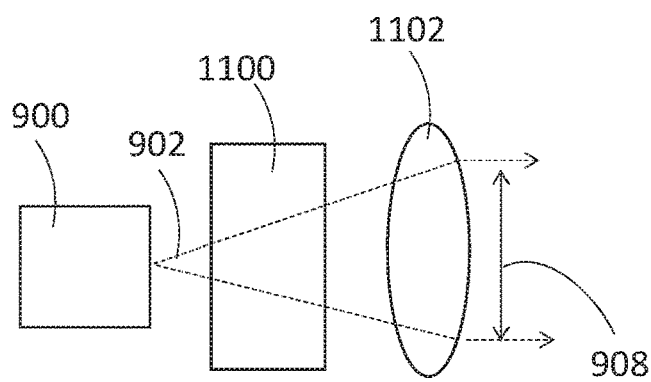
FIG. 11B
     
FIG. 11C           FIG. 11D

WAVELENGTH STABILIZATION OF LASER DIODES BY TEMPERATURE CONTROL

BACKGROUND

Technical Field

The present disclosure is generally directed to systems, devices, and methods relating to optical engines, for example, optical engines for laser projectors used in wearable heads-up displays or other applications.

Description of the Related Art

A projector is an optical device that projects or shines a pattern of light onto another object (e.g., onto a surface of another object, such as onto a projection screen) in order to display an image or video on that other object. A projector necessarily includes a light source, and a laser projector is a projector for which the light source comprises at least one laser. The at least one laser is temporally modulated to provide a pattern of laser light and usually at least one controllable mirror is used to spatially distribute the modulated pattern of laser light over a two-dimensional area of another object. The spatial distribution of the modulated pattern of laser light produces an image at or on the other object. In conventional scanning laser projectors, at least one controllable mirror may be used to control the spatial distribution, and may include: a single digital micromirror (e.g., a microelectromechanical system ("MEMS") based digital micromirror) that is controllably rotatable or deformable in two dimensions, or two digital micromirrors that are each controllably rotatable or deformable about a respective dimension, or a digital light processing ("DLP") chip comprising an array of digital micromirrors.

In a conventional laser projector comprising an RGB (red/green/blue) laser module with a red laser diode, a green laser diode, and a blue laser diode, each respective laser diode may have a corresponding respective focusing lens. Each of the laser diodes of a laser module are typically housed in a separate package (e.g., a TO-38 package or "can"). The relative positions of the laser diodes, the focusing lenses, and the at least one controllable mirror are all tuned and aligned so that each laser beam impinges on the at least one controllable mirror with substantially the same spot size and with substantially the same rate of convergence (so that all laser beams will continue to have substantially the same spot size as they propagate away from the laser projector towards, e.g., a projection screen). In a conventional laser projector, it is usually possible to come up with such a configuration for all these elements because the overall form factor of the device is not a primary design consideration. However, in applications for which the form factor of the laser projector is an important design element, it can be very challenging to find a configuration for the laser diodes, the focusing lenses, and the at least one controllable mirror that sufficiently aligns the laser beams (at least in terms of spot size, spot position, and rate of convergence) while satisfying the form factor constraints.

A head-mounted display is an electronic device that is worn on a user's head and, when so worn, secures at least one electronic display within a viewable field of at least one of the user's eyes, regardless of the position or orientation of the user's head. A wearable heads-up display is a head-mounted display that enables the user to see displayed content but also does not prevent the user from being able to see their external environment. The "display" component of a wearable heads-up display is either transparent or at a periphery of the user's field of view so that it does not completely block the user from being able to see their external environment. A "combiner" component of a wearable heads-up display is the physical structure where display light and environmental light merge as one within the user's field of view. The combiner of a wearable heads-up display is typically transparent to environmental light but includes some optical routing mechanism to direct display light into the user's field of view.

Examples of wearable heads-up displays include: the Google Glass®, the Optinvent Ora®, the Epson Moverio®, and the Sony Glasstron®, just to name a few.

The optical performance of a wearable heads-up display is an important factor in its design. One issue that affects optical performance is temperature dependent shifting of wavelengths of light output by laser diodes. Generally, the center wavelength of a laser diode is proportional to its operating temperature. As temperature increases, so does the center wavelength of the laser diode. For example, blue and green laser diodes may shift by approximately 0.030 nm/° C., and red laser diodes may shift by approximately 0.200 nm/° C. Such wavelength shift leads to undesirable variation of wavelengths of light output by the laser diodes during operation, which negatively affects the optical performance of a wearable heads-up display.

When it comes to face-worn devices, users also care a lot about aesthetics and comfort. This is clearly highlighted by the immensity of the eyeglass (including sunglass) frame industry. Independent of their performance limitations, many of the aforementioned examples of wearable heads-up displays have struggled to find traction in consumer markets because, at least in part, they lack fashion appeal or comfort. Most wearable heads-up displays presented to date employ relatively large components and, as a result, are considerably bulkier, less comfortable and less stylish than conventional eyeglass frames.

BRIEF SUMMARY

A wearable heads-up display (WHUD may be summarized as including: a support structure that in use is worn on the head of a user; a laser projector carried by the support structure, the laser projector comprising: an optical engine, comprising: a laser diode; at least one laser diode driver circuit operatively coupled to the laser diode to selectively drive current to the laser diode; and at least one temperature sensor operative to generate temperature sensor data indicative of a temperature of the laser diode; at least one scan mirror positioned to receive light output by the laser diode, the at least one scan mirror controllably orientable to redirect the light output by the laser diode over a range of angles; at least one nontransitory processor-readable storage medium that stores at least one of instructions or data; and at least one processor operatively coupled to the at least one nontransitory processor-readable storage medium, the at least one temperature sensor, and the laser projector, in operation, the at least one processor: receives temperature sensor data from the at least one temperature sensor; determines whether the temperature of the laser diode is below an operating temperature range; and responsive to a determination that the temperature of the laser diode is below the operating temperature range, controls the scan mirror to an out-of-view position wherein light emitted by the laser diode is redirected by the scan mirror to a position undetectable by the user; and controls the laser diode to emit light while the scan mirror is positioned in the out-of-view position.

Responsive to a determination that the temperature of the laser diode is below the operating temperature range, the at least one processor may control the laser diode to emit light while the scan mirror is positioned in the out-of-view position until the temperature of the laser diode reaches a threshold temperature value within the operating temperature range. The threshold temperature value may be equal to an upper end of the operating temperature range. The threshold temperature value may be below an upper end of the operating temperature range. Responsive to a determination that the temperature of the laser diode is below the operating temperature range, the at least one processor may alternatingly control the laser diode to emit light while the scan mirror is positioned in the out-of-view position and while the scan mirror is positioned in an in-view position wherein light emitted by the laser diode may be redirected by the scan mirror to a position detectable by the user until the temperature of the laser diode reaches a threshold temperature value within the operating temperature range. The optical engine may include a plurality of laser diodes, and the at least one temperature sensor may be operative to generate temperature sensor data indicative of the temperature of the plurality of laser diodes, wherein, in operation, the at least one processor may: receive temperature sensor data from the at least one temperature sensor; determine whether the temperature of the plurality of laser diodes is below the operating temperature range; and responsive to a determination that the temperature of at least one of the plurality of laser diodes is below the operating temperature range, control the scan mirror to an out-of-view position wherein light emitted by the plurality of laser diodes is redirected by the scan mirror to a position undetectable by the user; and control the at least one of the plurality of laser diodes to emit light while the scan mirror is positioned in the out-of-view position. The at least one temperature sensor may include a plurality of temperature sensors, each of the plurality of temperature sensors associated with a respective one of the plurality of laser diodes. The operating temperature range may be between 50° C. and 70° C.

A wearable heads-up display (WHUD) may be summarized as including: a support structure that in use is worn on the head of a user; a laser projector carried by the support structure, the laser projector comprising: an optical engine, comprising: a laser diode; at least one laser diode driver circuit operatively coupled to the laser diode to selectively drive current to the laser diode; at least one temperature sensor operative to generate temperature sensor data indicative of a temperature of the laser diode; and at least one heater positioned proximate the laser diode; at least one nontransitory processor-readable storage medium that stores at least one of instructions or data; and at least one processor operatively coupled to the at least one nontransitory processor-readable storage medium, the at least one temperature sensor, the at least one heater, and the laser projector, in operation, the at least one processor: receives temperature sensor data from the at least one temperature sensor; determines whether the temperature of the laser diode is below an operating temperature range; and responsive to a determination that the temperature of the laser diode is below the operating temperature range, controls the at least one heater to generate heat to increase the temperature of the laser diode.

The heater may include a resistive heater. Responsive to a determination that the temperature of the laser diode is below the operating temperature range, the at least one processor may control the heater to generate heat until the temperature of the laser diode reaches a threshold temperature value within the operating temperature range. The threshold temperature value may be equal to an upper end of the operating temperature range. The threshold temperature value may be below an upper end of the operating temperature range. The optical engine may include a plurality of laser diodes and a plurality of heaters, each of the plurality of heaters operative to provide heat to a respective one of the plurality of laser diodes, and the at least one temperature sensor may be operative to generate temperature sensor data indicative of the temperature of the plurality of laser diodes, wherein, in operation, the at least one processor may: for each of the plurality of laser diodes, receive temperature sensor data from the at least one temperature sensor; determine whether the temperature of the laser diode is below the operating temperature range; and responsive to a determination that the temperature of the laser diode is below the operating temperature range, control the heater operative to provide heat to the laser diode to generate heat. The at least one temperature sensor may include a plurality of temperature sensors, each of the plurality of temperature sensors associated with a respective one of the plurality of laser diodes. The operating temperature range may be between 50° C. and 70° C. The at least one heater may be positioned on a base substrate proximate the laser diode. The laser diode may be bonded to a base substrate via a chip submount, and the at least one heater may be bonded to the chip submount.

A method of operating a wearable heads-up display (WHUD) may be summarized as: the WHUD comprising a support structure that in use is worn on the head of a user, a laser projector carried by the support structure, the laser projector comprising: an optical engine, comprising: a laser diode, at least one laser diode driver circuit operatively coupled to the laser diode to selectively drive current to the laser diode, at least one temperature sensor operative to generate temperature sensor data indicative of a temperature of the laser diode, at least one heater positioned proximate the laser diode, and at least one scan mirror positioned to receive light output by the laser diode, the at least one scan mirror controllably orientable to redirect the light output by the laser diode over a range of angles, the method comprising: receiving, by at least one processor, temperature sensor data from the at least one temperature sensor; determining, by the at least one processor, whether the temperature of the laser diode is below an operating temperature range; and responsive to determining that the temperature of the laser diode is below the operating temperature range, controlling, by the at least one processor, the scan mirror to an out-of-view position wherein light emitted by the laser diode is redirected by the scan mirror to a position undetectable by the user; and controlling, by the at least one processor, the laser diode to emit light while the scan mirror is positioned in the out-of-view position.

A method of operating a wearable heads-up display (WHUD) may be summarized as: the WHUD comprising a support structure that in use is worn on the head of a user, a laser projector carried by the support structure, the laser projector comprising: an optical engine, comprising: a laser diode, at least one laser diode driver circuit operatively coupled to the laser diode to selectively drive current to the laser diode, and at least one temperature sensor operative to generate temperature sensor data indicative of a temperature of the laser diode, the method comprising: receiving, by at least one processor, temperature sensor data from the at least one temperature sensor; determining, by the at least one processor, whether the temperature of the laser diode is below an operating temperature range; and responsive to determining that the temperature of the laser diode is below the operating temperature range, controlling, by the at least one processor, the at least one heater to generate heat to increase the temperature of the laser diode.

An optical system for collimating and shifting light which propagates in the direction of a propagation axis, a cross-section of the light being defined by a fast axis and a slow axis, where each of the propagation axis, fast axis, and slow axis are orthogonal to each other, may be summarized as including: a first lens having a first input face and a first output face, the first input face having a convex shape with respect to the fast axis, the first output face having a straight shape with respect to the fast axis, and the first output face being at a non-zero angle with respect to the fast axis; and a second lens spatially separated from the first lens, the second lens having a second input face and a second output face, the second input face having a straight shape with respect to the fast axis, the second input face being at a non-zero angle with respect to the fast axis, and the second output face having a convex shape with respect to the slow axis. The first output face and the second input face may be at the same non-zero angle with respect to the fast axis.

An optical system for collimating and shifting light which propagates in the direction of a propagation axis, a cross-section of the light being defined by a fast axis and a slow axis, where each of the propagation axis, fast axis, and slow axis are orthogonal to each other, may be summarized as including: a lens having an input face and an output face, the input face having a convex shape with respect to the fast axis, the output face having a straight shape with respect to the fast axis, the output face being at a non-zero angle with respect to the fast axis, and the output face having a convex shape with respect to the slow axis.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

FIG. 11A is a left side sectional view of a laser diode and a set of collimation lenses for circularizing and collimating a beam of light.

FIG. 11B is a top side sectional elevational view of the laser diode and the set of collimation lenses of FIG. 11A.

FIGS. 11C and 11D are isometric views of exemplary lens shapes which could be used as a collimation lens in the implementation of FIGS. 11A and 11B.

DETAILED DESCRIPTION

Figure 1A:
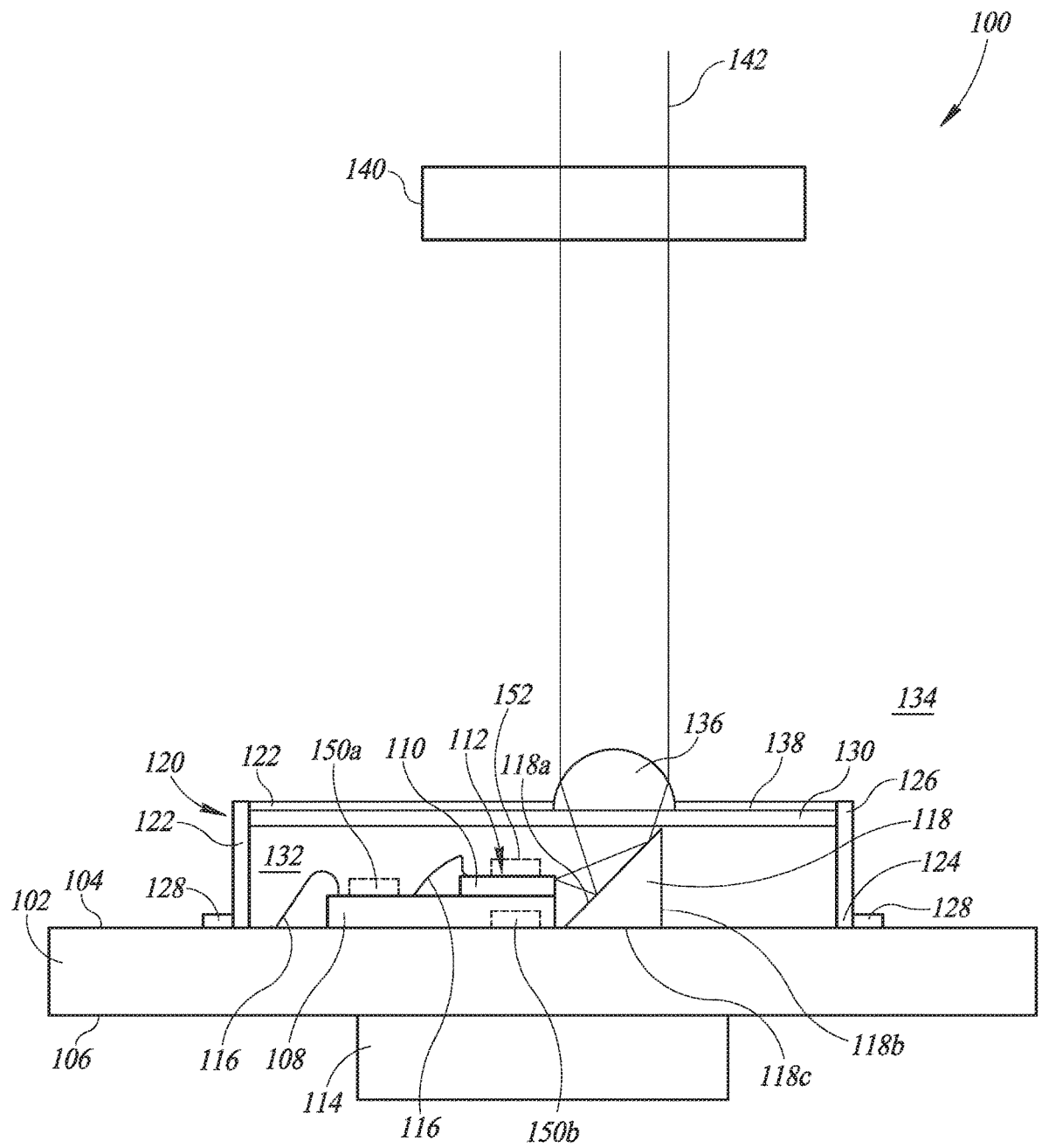
FIG. 1A is a left side, sectional elevational view of an optical engine, in accordance with the present systems, devices, and methods.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

One or more implementations of the present disclosure provide laser-based optical engines, for example, laser-based optical engines for laser projectors used in wearable heads-up displays or other applications. Generally, the optical engines discussed herein integrate a plurality of laser dies or diodes (e.g., 3 laser diodes, 4 laser diodes) within a single, hermetically or partially hermetically sealed, encapsulated package. As discussed further below, in at least some implementations, wavelength stabilization for the laser diodes may be achieved by controlling the temperature of the lasers to always be in a particular range of operating temperatures (e.g., 50-70° C.) that provides wavelength stabilization that meets particular performance criteria.

As noted above, blue and green laser diodes may shift by approximately 0.030 nm/° C., and red laser diodes may shift by approximately 0.200 nm/° C., for example. Such wavelength shift leads to undesirable variation of wavelengths of light output by the laser diodes during operation, which negatively affects the optical performance of a wearable heads-up display. In at least some implementations, the laser diodes themselves may be used for temperature control by selectively switching them on to maintain their temperature within a specified operating range. In such implementations, a controllable mirror may be positioned to direct light to an out-of-view location (e.g., outside of an eye box) that is undetectable by a user of an HMD system, such that the wearer of the HMD cannot detect the light generated for the purpose of temperature control (as opposed to light generated for display purposes). In other implementations, one or more heaters (e.g., compact resistive heaters) may be positioned proximate the laser diodes to control the temperature of the laser diodes during operation to achieve wavelength stabilization. Additional features of the implementations of the present disclosure are discussed below with reference to the Figures.

Figure 1B:
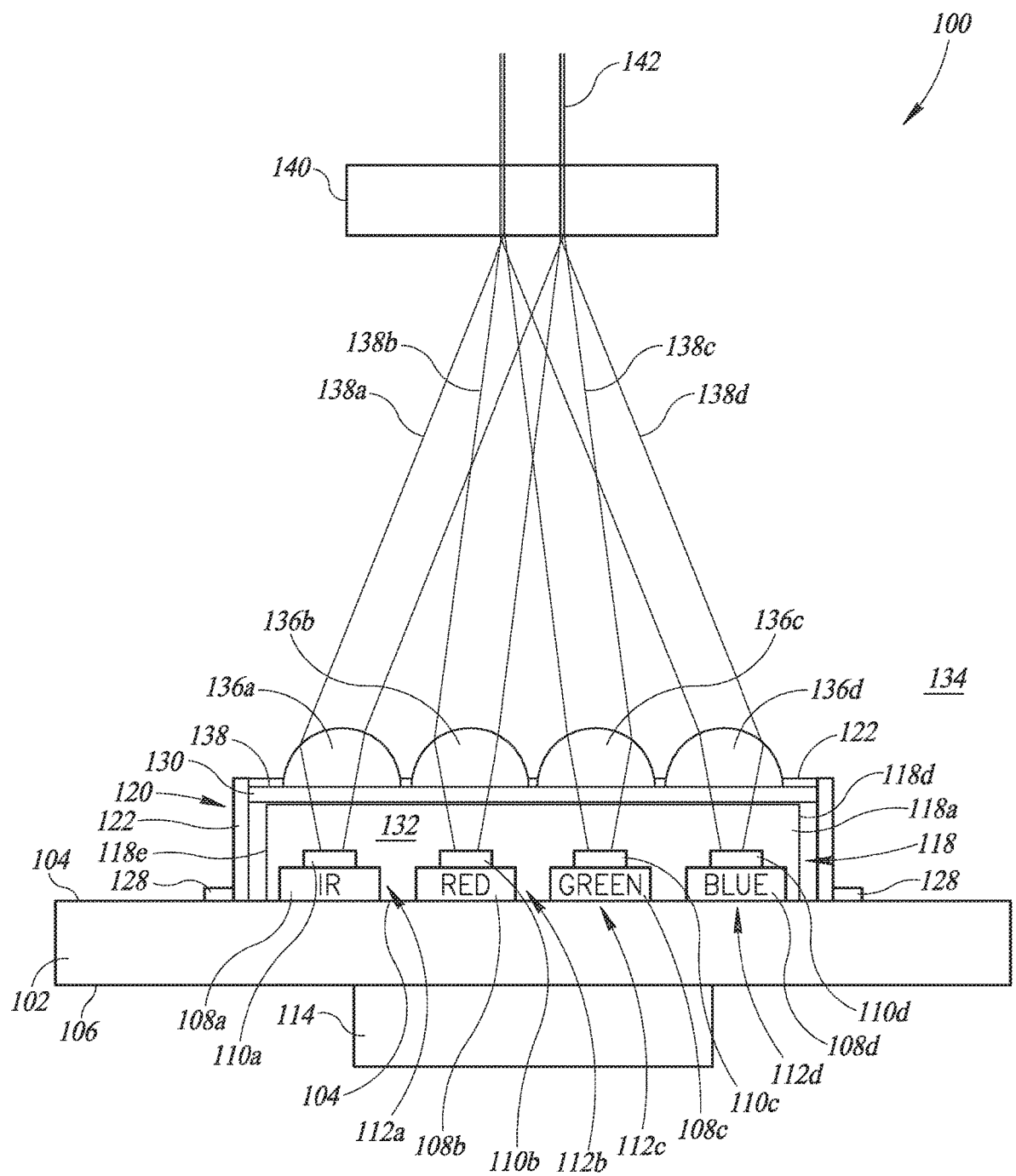
FIG. 1B is a front side, sectional elevational view of the optical engine also shown in FIG. 1A, in accordance with the present systems, devices, and methods.

FIG. 1A is a left side, elevational sectional view of an optical engine 100, which may also be referred to as a "multi-laser diode module" or an "RGB laser module," in accordance with the present systems, devices, and methods. FIG. 1B is a front side, elevational sectional view of the optical engine 100. The optical engine 100 includes a base substrate 102 having a top surface 104 and a bottom surface 106 opposite the top surface. The base substrate 102 may be formed from a material that is radio frequency (RF) compatible and is suitable for hermetic sealing. For example, the base substrate 102 may be formed from low temperature co-fired ceramic (LTCC), aluminum nitride (AlN), alumina, Kovar®, other ceramics with suitable thermal properties, etc. The term Kovar® generally refers to iron-nickel-cobalt alloys having similar thermal expansion coefficients to glass and ceramics, thus making Kovar® materials particularly suitable for forming hermetic seals which remain functional in a wide range of temperatures.

The optical engine 100 also includes a plurality of chip submounts 108a-108d (collectively 108) bonded (e.g., attached) to the top surface 104 of the base substrate 102. The plurality of chip submounts 108 are aligned in a row across a width of the optical engine 100 between the left and right sides thereof. Each of the plurality of chip submounts 108 includes a laser diode 110, also referred to as a laser chip or laser die, bonded thereto. In particular, an infrared chip submount 108a carries an infrared laser diode 110a, a red chip submount 108b carries a red laser diode 110b, a green chip submount 108c carries a green laser diode 110c, and a blue chip submount 108d carries a blue laser diode 110d. In operation, the infrared laser diode 110a provides infrared laser light, the red laser diode 110b provides red laser light, the green laser diode 110c provides green laser light, and the blue laser diode 110d provides blue laser light. Each of the laser diodes 110 may comprise one of an edge emitter laser or a vertical-cavity surface-emitting laser (VCSEL), for example. Each of the four laser diode/chip submount pairs may be referred to collectively as a "laser chip on submount," or a laser CoS 112. Thus, the optical engine 100 includes an infrared laser CoS 112a, a red laser CoS 112b, a green laser CoS 112c, and a blue laser CoS 112d. In at least some implementations, one or more of the laser diodes 110 may be bonded directly to the base substrate 102 without use of a submount 108. It should be appreciated that although some implementations discussed herein describe laser diodes as chips or dies on submounts, other dies or types of devices, e.g., p-side down devices, may be used as well.

The optical engine 100 also includes a laser diode driver circuit 114 bonded to the bottom surface 106 of the base substrate 102. The laser diode driver circuit 114 is operatively coupled to the plurality of laser diodes 110 via suitable electrical connections 116 to selectively drive current to the plurality of laser diodes. In at least some implementations, the laser diode driver circuit 114 may be positioned relative to the CoSs 112 to minimize the distance between the laser diode driver circuit 114 and the CoSs 112. Although not shown in FIGS. 1A and 1B, the laser diode driver circuit 114 may be operatively coupleable to a controller (e.g., microcontroller, microprocessor, ASIC) which controls the operation of the laser diode driver circuit 114 to selectively modulate laser light emitted by the laser diodes 110. In at least some implementations, the laser diode driver circuit 114 may be bonded to another portion of the base substrate 102, such as the top surface 104 of the base substrate. In at least some implementations, the laser diode driver circuitry 114 may be remotely located and operatively coupled to the laser diodes 110. In order to not require the use of impedance matched transmission lines, the size scale may be small compared to a wavelength (e.g., lumped element regime), where the electrical characteristics are described by (lumped) elements like resistance, inductance, and capacitance.

A laser diode driver circuit as discussed in the present application can include any appropriate circuit for applying controlled power to at least one laser diode. For example, a laser diode driver circuit could be a constant current driver, a constant voltage driver, a pulsing driver, a low power driver, or a high power driver.

Proximate the laser diodes 110 there is positioned an optical director element 118. Like the chip submounts 108, the optical director element 118 is bonded to the top surface 104 of the base substrate 102. In the illustrated example, the optical director element 118 has a triangular prism shape that includes a plurality of planar faces. In particular the optical director element 118 includes an angled front face 118a that extends along the width of the optical engine 100, a rear face 118b, a bottom face 118c that is bonded to the top surface 104 of the base substrate 102, a left face 118d, and a right face 118e opposite the left face. The optical director element 118 may comprise a mirror or a prism, for example.

The optical engine 100 also includes a cap 120 that includes a vertical sidewall 122 having a lower first end 124 and an upper second end 126 opposite the first end. A flange 128 may be disposed around a perimeter of the sidewall 122 adjacent the lower first end 124. Proximate the upper second end 126 of the sidewall 122 there is a horizontal optical window 130 that forms the "top" of the cap 120. The sidewall 122 and the optical window 130 together define an interior volume 132 sized and dimensioned to receive the plurality of chip submounts 108, the plurality of laser diodes 110, and the optical director element 118. The lower first end 124 and the flange 128 of the cap 120 are bonded to the base substrate 102 to provide a hermetic or partially hermetic seal between the interior volume 132 of the cap and a volume 134 exterior to the cap.

As shown best in FIG. 1A, the optical director element 118 is positioned and oriented to direct (e.g., reflect) laser light received from each of the plurality of laser diodes 110 upward (as shown) toward the optical window 130 of the cap 120, wherein the laser light exits the interior volume 132.

The cap 120 may have a round shape, rectangular shape, or other shape. Thus, the vertical sidewall 122 may comprise a continuously curved sidewall, a plurality (e.g., four) of adjacent planar portions, etc. The optical window 130 may comprise an entire top of the cap 120, or may comprise only a portion thereof. In at least some implementations, the optical window 130 may be located on the sidewall 122 rather than positioned as a top of the cap 120, and the laser diodes 110 and/or the optical director element 118 may be positioned and oriented to direct the laser light from the laser diodes toward the optical window on the sidewall 122. At least some implementations may not include optical director element 118 such that laser light from the laser diodes may be output towards the optical window on the sidewall 122 without the need for intervening optical elements. In at least some implementations, the cap 120 may include a plurality of optical windows instead of a single optical window.

The optical engine 100 also includes four collimation/pointing lenses 136a-136d (collectively 136), one for each of the four laser diodes 110a-110d, respectively, that are bonded to a top surface 138 of the optical window 130. Each of the plurality of collimation lenses 136 is positioned and oriented to receive light from a corresponding one of the laser diodes 110 through the optical window 130. In particular, the collimation lens 136a receives light from the infrared laser diode 110a via the optical director element 118 and the optical window 130, the collimation lens 136b receives light from the red laser diode 110b via the optical director element and the optical window, the collimation lens 136c receives light from the green laser diode 110c via the optical director element and the optical window, and the collimation lens 136d receives light from the blue laser diode 110d via the optical director element and the optical window.

Each of the collimation lenses 136 is operative to receive laser light from a respective one of the laser diodes 110, and to generate a single color beam. In particular, the collimation lens 136a receives infrared laser light from the infrared laser diode 110a and produces an infrared laser beam 138a, the collimation lens 136b receives red laser light from the red laser diode 110b and produces a red laser beam 138b, the collimation lens 136c receives green laser light from the green laser diode 110c and produces a green laser beam 138c, and the collimation lens 136d receives blue laser light from the blue laser diode 110d and produces a blue laser beam 138d.

Figure 3:
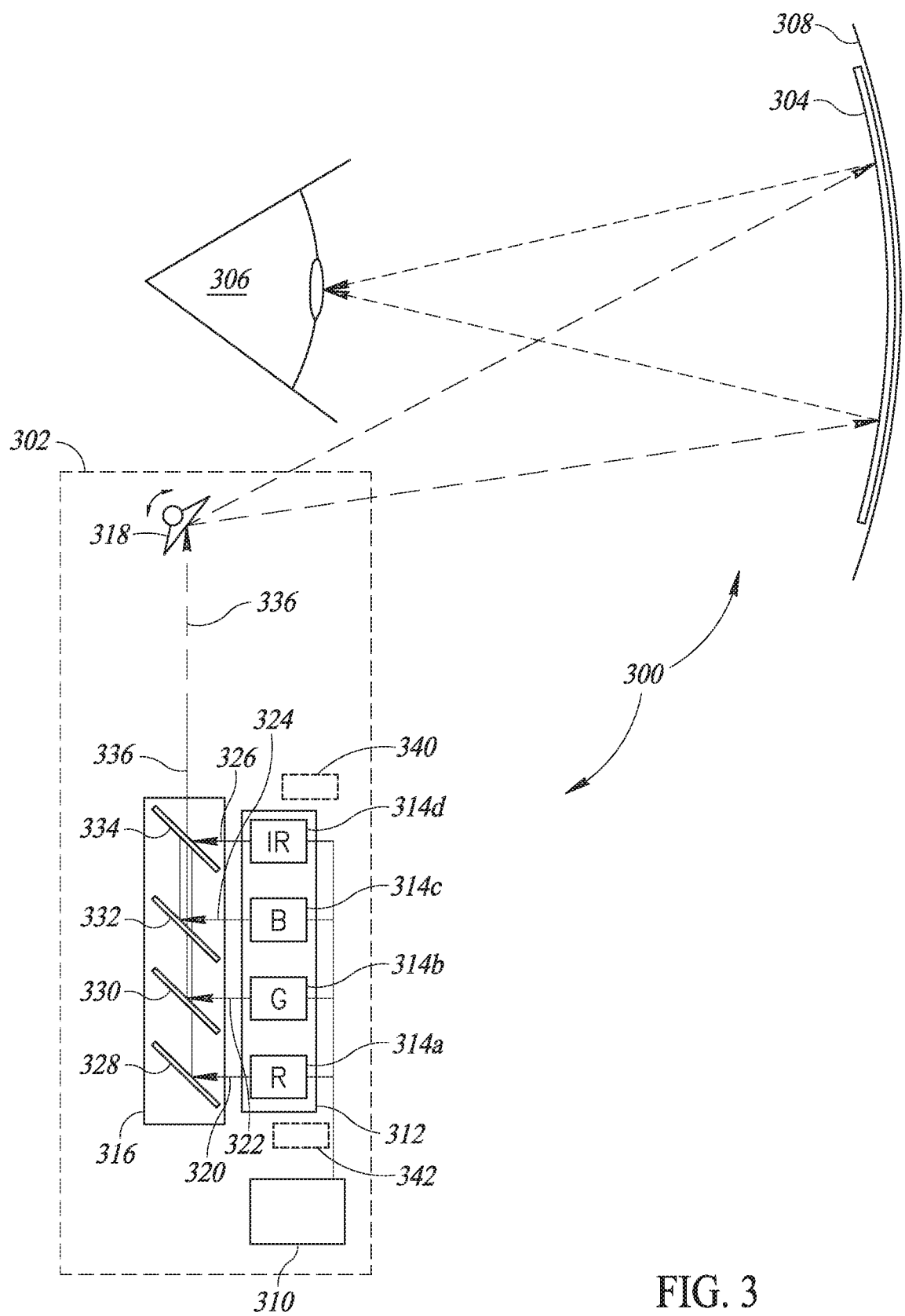
FIG. 3 is a schematic diagram of a wearable heads-up display with a laser projector that includes an optical engine, and a transparent combiner in a field of view of an eye of a user, in accordance with the present systems, devices, and methods.

The optical engine 100 may also include, or may be positioned proximate to, a beam combiner 140 that is positioned and oriented to combine the light beams 138a-138d received from each of the collimation lenses 136 into a single aggregate beam 142. As an example, the beam combiner 140 may include one or more diffractive optical elements (DOE) and/or refractive/reflective optical elements that combine the different color beams 138a-138d in order to achieve coaxial superposition. An example beam combiner is shown in FIG. 3 and discussed below.

In at least some implementations, the laser CoSs 112, the optical director element 118, and/or the collimation lenses 136 may be positioned differently. As noted above, laser diode driver circuit 114 may be mounted on the top surface 104 or the bottom surface 106 of the base substrate 102, depending on the RF design and other constraints (e.g., package size). In at least some implementations, the optical engine 100 may not include the optical director element 118, and the laser light may be directed from the laser diodes 110 toward the collimation lenses 136 without requiring an intermediate optical director element. Additionally, in at least some implementations, one or more of the laser diodes may be mounted directly on the base substrate 102 without use of a submount.

For the sake of a controlled atmosphere inside the interior volume 132, it may be desirable to have no organic compounds inside the interior volume 132. In at least some implementations, the components of the optical engine 100 may be bonded together using no adhesives. In other implementations, a low amount of adhesives may be used to bond at least one of the components, which may reduce cost while providing a relatively low risk of organic contamination for a determined lifetime (e.g., 2 or more years) of the optical engine 100. The use of adhesives may result in a partial hermetic seal, but this partial hermetic seal may be acceptable in certain applications, as detailed below.

Generally, "hermetic" refers to a seal which is airtight, that is, a seal which excludes the passage of air, oxygen, and other gases. "Hermetic" within the present specification carries this meaning. Further, "partially hermetic" as used herein refers to a seal which limits, but does not necessarily completely prevent, the passage of gases such as air. "Partially hermetic" as used herein may alternatively be stated as "reduced hermiticity". In the example above, adhesives may be used to bond components. Such adhesives may result in a seal being not completely hermetic, in that some amount of gasses may slowly leak through the adhesive. However, such a seal can still be considered "partially hermetic" or as having "reduced hermiticity", because the seal reduces the flow of gasses therethrough.

In one example application, even in an environment with only partial hermiticity, the life of laser diodes 110 and transparency of optical window 130 may be maintained longer than the life of a battery of a device, such that partial hermiticity may be acceptable for the devices. In some cases, even protecting interior volume 132 from particulate with a dust cover may be sufficient to maintain laser diodes 110 and transparency of optical window 130 for the intended lifespan of the device. In some cases, laser diodes 110 and transparency of optical window 130 may last for the intended lifespan of the device even without a protective cover. Various bonding processes (e.g., attaching processes) for the optical engine 100 are discussed below with reference to FIG. 5.

As shown in FIG. 1A, the optical engine 100 may include one or more temperature sensors 152 positioned proximate the laser diodes 110. For example, the optical engine 100 may include one temperature sensor 152 positioned proximate the laser diodes 110 that is operative to sense the temperature of the plurality of laser diodes. As another example, the optical engine may include a plurality of temperature sensors 152 that each senses the temperature of a corresponding one of the plurality of laser diodes 110. As discussed below with reference to FIGS. 6 and 7, the at least one temperature sensor 152 may be used to provide wavelength stabilization functionality for the laser diodes 110 during operation.

A temperature sensor as described in this application could include, for example, a thermocouple, a resistance temperature detector (RTD), a thermistor, a semiconductor-based temperature sensing integrated circuit, a thermostat, or any other temperature sensor appropriate for the applications discussed herein.

As shown in FIG. 1A, in at least some implementations, the optical engine may include one or more heaters 150 (e.g., compact resistive heaters) positioned proximate the laser diodes 110. In the example shown, a heater 150b is bonded to the base substrate 102 proximate the laser diodes 110. Alternatively or additionally, a heater 150a may be bonded directly to the chip submount 108 of each of the laser diodes 110. In some implementations, a single heater 150 may be provided for a plurality of laser diodes 110 (e.g., one heater for four laser diodes, one heater for two laser diodes). In other implementations, a separate heater 150 may be provided for each of the plurality of laser diodes 110. As discussed further below with reference to FIG. 7, the one or more heaters 150 may be used to provide wavelength stabilization functionality for the laser diodes 110 during operation.

Figure 2:
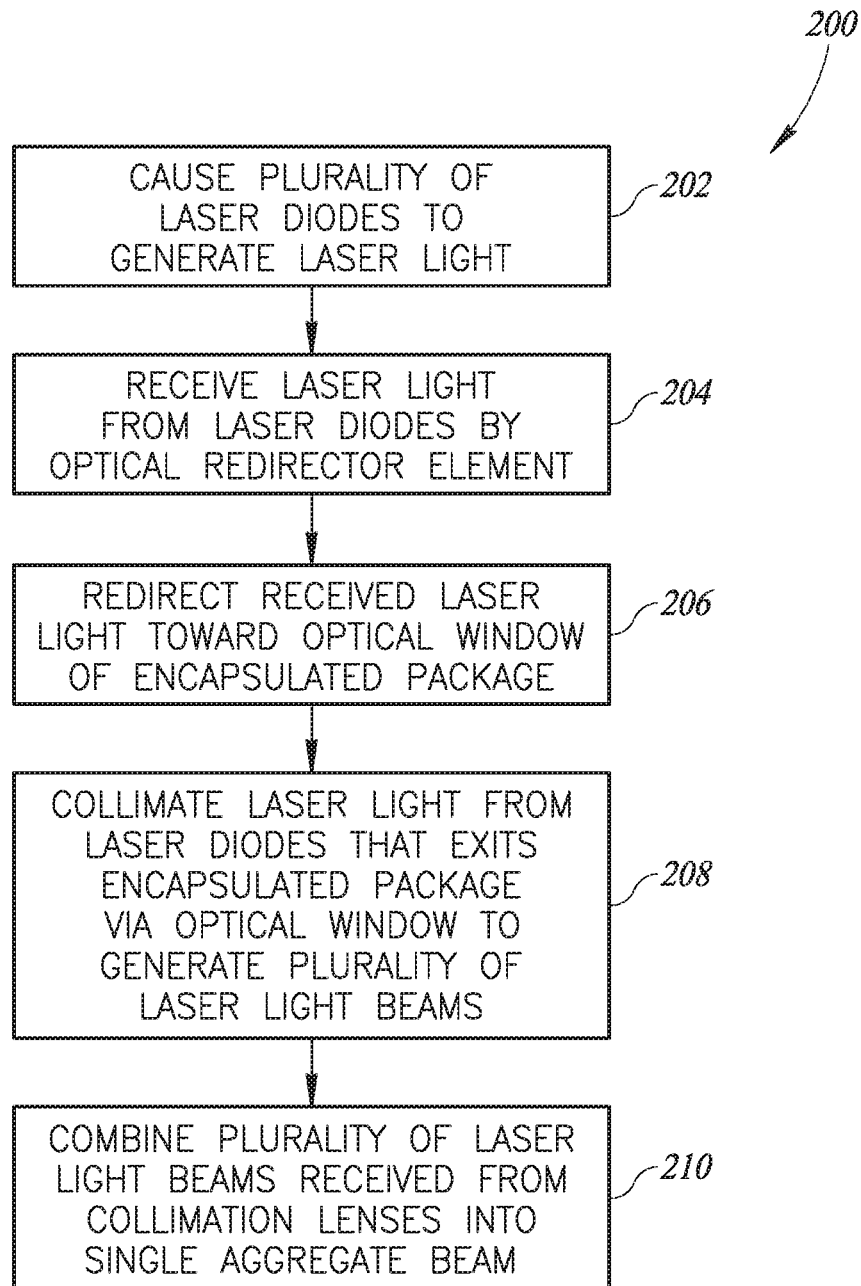
FIG. 2 is a flow diagram of a method of operating an optical engine, in accordance with the present systems, devices, and methods.

FIG. 2 is a flow diagram of a method 200 of operating an optical engine, in accordance with the present systems, devices, and methods. The method 200 may be implemented using the optical engine 100 of FIGS. 1A-1B, for example. It should be appreciated that methods of operating optical engines according to the present disclosure may include fewer or additional acts than set forth in the method 200. Further, the acts discussed below may be performed in an order different than the order presented herein.

At 202, at least one controller may cause a plurality of laser diodes of an optical engine to generate laser light. As discussed above, the plurality of laser diodes may be hermetically or partially hermetically sealed in an encapsulated package. The laser diodes may produce light sequentially and/or simultaneously with each other. At 204, at least one optical director element may optionally receive the laser light from the laser diodes. The optical director element may comprise a mirror or a prism, for example. As discussed above, in at least some implementations the optical engine may be designed such that laser light exits the optical engine without use of an optical director element.

At 206, the at least one optical director element, if included, may direct the received laser light toward an optical window of the encapsulated package. For example, the optical director element may reflect the received laser light toward the optical window of the encapsulated package. In implementations without at least one optical director element, the laser light generated by the plurality of laser diodes may be output directly toward the optical window of the encapsulated package.

At 208, a plurality of collimation lenses may collimate the laser light from the laser diodes that exits the encapsulated package via the optical window to generate a plurality of differently colored laser light beams. The collimation lenses may be positioned inside or outside of the encapsulated package. As an example, the collimation lenses may be physically coupled to the optical window of the encapsulated package.

At 210, a beam combiner may combine the plurality of laser light beams received from each of the collimation lenses into a single aggregate beam. The beam combiner may include one or more diffractive optical elements (DOE) that combine different color beams in order to achieve coaxial superposition, for example. The beam combiner may include one or more DOEs and/or one or more refractive/reflective optical elements. An example beam combiner is shown in FIG. 3 and discussed below.

FIG. 3 is a schematic diagram of a wearable heads-up display (WHUD) 300 with an exemplary laser projector 302, and a transparent combiner 304 in a field of view of an eye 306 of a user of the WHUD, in accordance with the present systems, devices, and methods. The WHUD 300 includes a support structure (not shown), with the general shape and appearance of an eyeglasses frame, carrying an eyeglass lens 308 with the transparent combiner 304, and the laser projector 302.

The laser projector 302 comprises a controller or processor 310, an optical engine 312 comprising four laser diodes 314a, 314b, 314c, 314d (collectively 314) communicatively coupled to the processor 310, a beam combiner 316, and a scan mirror 318. The optical engine 312 may be similar or identical to the optical engine 100 discussed above with reference to FIGS. 1A and 1B. Generally, the term "processor" refers to hardware circuitry, and may include any of microprocessors, microcontrollers, application specific integrated circuits (ASICs), digital signal processors (DSPs), programmable gate arrays (PGAs), and/or programmable logic controllers (PLCs), or any other integrated or non-integrated circuit.

During operation of the WHUD 300, the processor 310 modulates light output from the laser diodes 314, which includes a first red laser diode 314a (R), a second green laser diode 314b (G), a third blue laser diode 314c (B), and a fourth infrared laser diode 314d (IR). The first laser diode 314a emits a first (e.g., red) light signal 320, the second laser diode 314b emits a second (e.g., green) light signal 322, the third laser diode 314c emits a third (e.g., blue) light signal 324, and the fourth laser diode 314d emits a fourth (e.g., infrared) light signal 326. All four of light signals 320, 322, 324, and 326 enter or impinge on the beam combiner 316. Beam combiner 316 could for example be based on any of the beam combiners described in U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), and/or U.S. Non-Provisional patent application Ser. No. 15/852,205 (U.S. Publication Number 2018/0210216).

In the illustrated example, the beam combiner 316 includes optical elements 328, 330, 332, and 334. The first light signal 320 is emitted towards the first optical element 328 and reflected by the first optical element 328 of the beam combiner 316 towards the second optical element 330 of the beam combiner 316. The second light signal 322 is also directed towards the second optical element 330. The second optical element 330 is formed of a dichroic material that is transmissive of the red wavelength of the first light signal 320 and reflective of the green wavelength of the second light signal 322. Therefore, the second optical element 330 transmits the first light signal 320 and reflects the second light signal 322. The second optical element 330 combines the first light signal 320 and the second light signal 322 into a single aggregate beam (shown as separate beams for illustrative purposes) and routes the aggregate beam towards the third optical element 332 of the beam combiner 316.

The third light signal 324 is also routed towards the third optical element 332. The third optical element 332 is formed of a dichroic material that is transmissive of the wavelengths of light (e.g., red and green) in the aggregate beam comprising the first light signal 320 and the second light signal 322 and reflective of the blue wavelength of the third light signal 324. Accordingly, the third optical element 332 transmits the aggregate beam comprising the first light signal 320 and the second light signal 322 and reflects the third light signal 324. In this way, the third optical element 332 adds the third light signal 324 to the aggregate beam such that the aggregate beam comprises the light signals 320, 322, and 324 (shown as separate beams for illustrative purposes) and routes the aggregate beam towards the fourth optical element 334 in the beam combiner 316.

The fourth light signal 326 is also routed towards the fourth optical element 334. The fourth optical element 334 is formed of a dichroic material that is transmissive of the visible wavelengths of light (e.g., red, green, and blue) in the aggregate beam comprising the first light signal 320, the second light signal 322, and the third light signal 324 and reflective of the infrared wavelength of the fourth light signal 326. Accordingly, the fourth optical element 334 transmits the aggregate beam comprising the first light signal 320, the second light signal 322, and the third light signal 324 and reflects the fourth light signal 326. In this way, the fourth optical element 334 adds the fourth light signal 326 to the aggregate beam such that the aggregate beam 336 comprises portions of the light signals 320, 322, 324, and 326. The fourth optical element 334 routes the aggregate beam 336 towards the controllable scan mirror 318.

The scan mirror 318 is controllably orientable and scans (e.g. raster scans) the beam 336 to the eye 306 of the user of the WHUD 300. In particular, the controllable scan mirror 318 scans the laser light onto the transparent combiner 304 carried by the eyeglass lens 308. The scan mirror 318 may be a single bi-axial scan mirror or two single-axis scan mirrors may be used to scan the laser light onto the transparent combiner 304, for example. Scan mirror 318 may be a single bi-axial MEMS mirror or two single-axis MEMS mirrors. In an exemplary implementation, scan mirror 318 may include a fast-axis mirror which scans in one direction, and a slow-axis mirror which scans in a direction orthogonal to the fast axis mirror. The slow-axis mirror can sweep from a starting position across a display area in a first direction at a relatively low speed, and then quickly move back opposite the first direction to return to the starting position. This cycle should preferably occur at a frequency equal to a frame rate of the display (e.g. 30 Hz, 50 Hz, 60 Hz). The fast axis mirror can oscillate back and forth at a high frequency in orthogonal directions to the slow-axis mirror. The fast axis mirror should preferably oscillate at a frequency such that for each pixel row (i.e., the time it takes the slow axis mirror to sweep one pixel) the fast axis mirror will scan across the entire display. In this way, a two-dimensional display can be projected, by the fast-axis mirror redirecting the beam across one dimension of the display, and the slow-axis mirror redirecting the beam across an orthogonal direction of the display. In at least some implementations, the transparent combiner 304 may be a holographic combiner with at least one holographic optical element. The transparent combiner 304 redirects the laser light towards a field of view of the eye 306 of the user. The laser light redirected towards the eye 306 of the user may be collimated by the transparent combiner 304, wherein the spot at the transparent combiner 304 is approximately the same size and shape as the spot at the eye 306 of the user. The laser light may be converged by the eye 306 to a focal point at the retina of eye 306 and creates an image that is focused. The visible light may create display content in the field of view of the user, and the infrared light may illuminate the eye 306 of the user for the purpose of eye tracking.

In the illustrated implementation, optical engine 340 includes at least one temperature sensor 340 operative to sense or detect the operating temperature of the laser diodes 314. As discussed above, the temperature sensor 340 may include a single temperature sensor or a plurality of temperature sensors (e.g., one temperature sensor for each of the plurality of laser diodes).

In at least some implementations, the optical engine 340 may include one or more heaters 342 positioned proximate the laser diodes 314. In operation, the one or more heaters 342 may be used to selectively control the temperature of the laser diodes 314 to provide wavelength stabilization for the laser diodes. Wavelength stabilization features of the present disclosure are discussed further below with reference to FIGS. 6 and 7.

Figure 4:
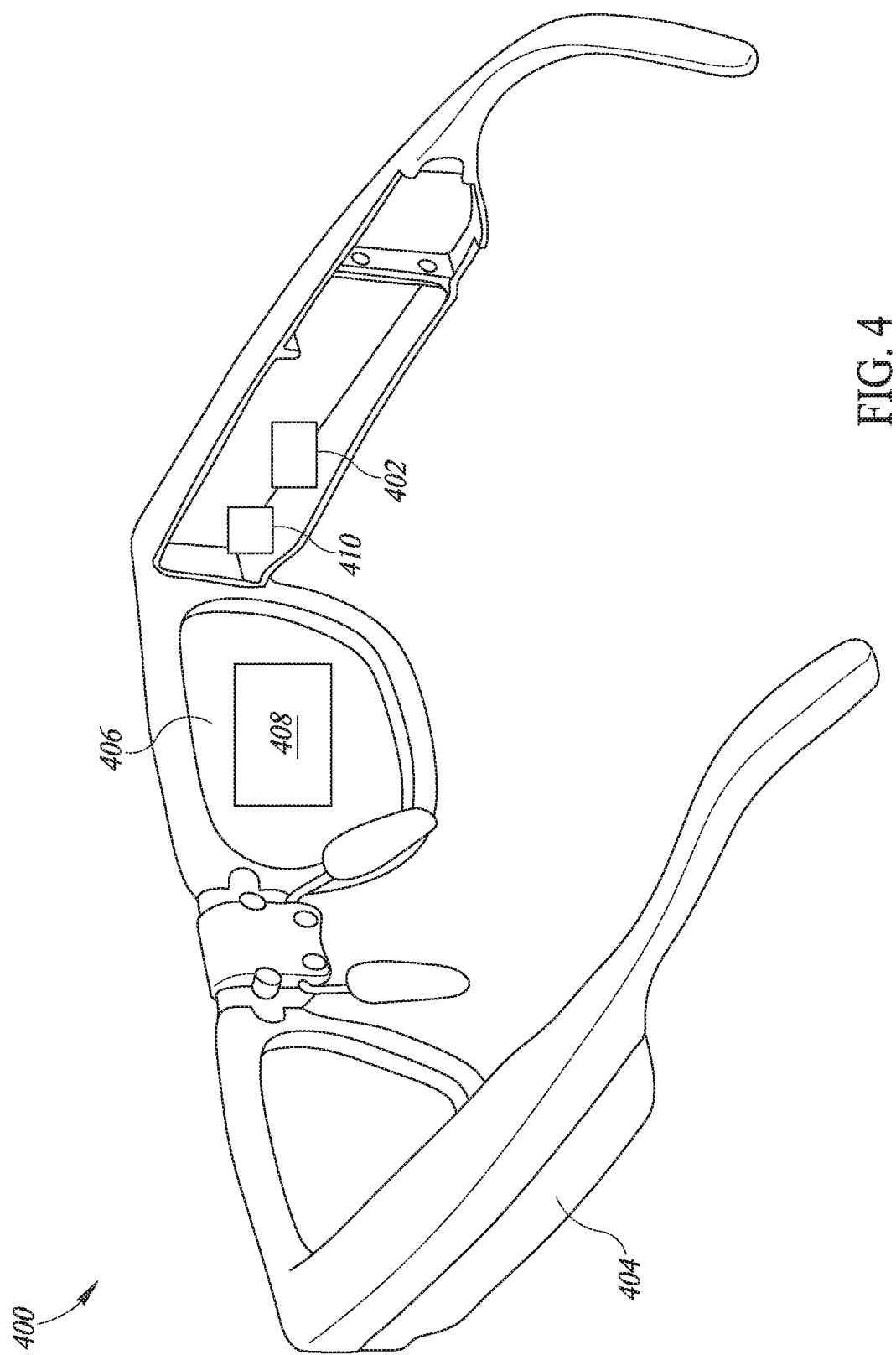
FIG. 4 is an isometric view of a wearable heads-up display with a laser projector that includes an optical engine, in accordance with the present systems, devices, and methods.

FIG. 4 is a schematic diagram of a wearable heads-up display (WHUD) 400 with a laser projector 402 in accordance with the present systems, devices, and methods. WHUD 400 includes a support structure 404 with the shape and appearance of a pair of eyeglasses that in use is worn on the head of the user. The support structure 404 carries multiple components, including eyeglass lens 406, a transparent combiner 408, the laser projector 402, and a controller or processor 410. The laser projector 402 may be similar or identical to the laser projector 302 of FIG. 3. For example, the laser projector 402 may include an optical engine, such as the optical engine 100 or the optical engine 312. The laser projector 402 may be communicatively coupled to the controller 410 (e.g., microprocessor) which controls the operation of the projector 402, as discussed above. The controller 410 may include or may be communicatively coupled to a non-transitory processor-readable storage medium (e.g., memory circuits such as ROM, RAM, FLASH, EEPROM, memory registers, magnetic disks, optical disks, other storage), and the controller may execute data and/or instruction from the non-transitory processor readable storage medium to control the operation of the laser projector 402.

In operation of the WHUD 400, the controller 410 controls the laser projector 402 to emit laser light. As discussed above with reference to FIG. 3, the laser projector 402 generates and directs an aggregate beam (e.g., aggregate beam 336 of FIG. 3) toward the transparent combiner 408 via at least one controllable mirror (not shown in FIG. 4). The aggregate beam is directed towards a field of view of an eye of a user by the transparent combiner 408. The transparent combiner 408 may collimate the aggregate beam such that the spot of the laser light incident on the eye of the user is at least approximately the same size and shape as the spot at transparent combiner 408. The transparent combiner 408 may be a holographic combiner that includes at least one holographic optical element.

Figure 5:
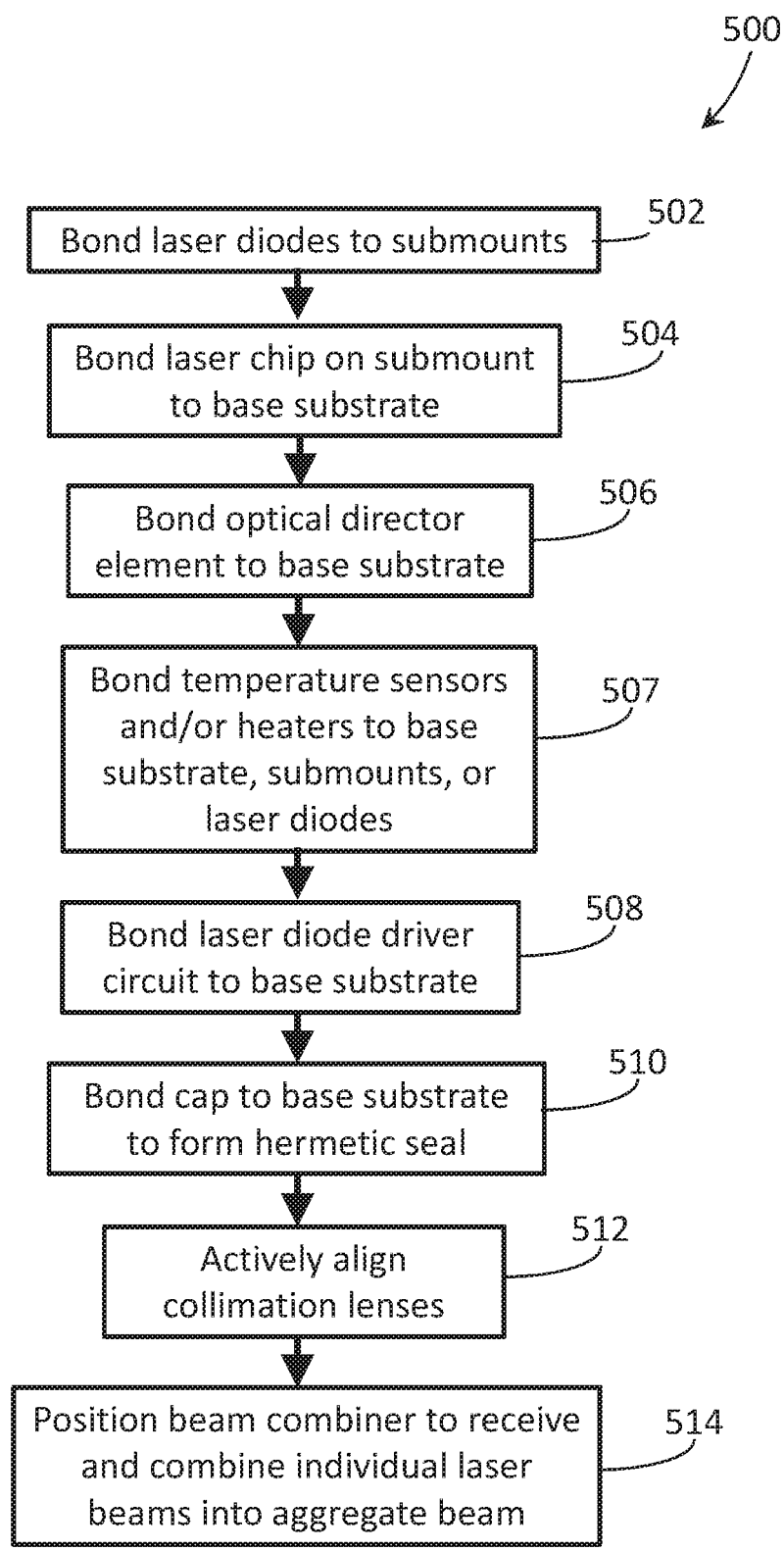
FIG. 5 is a flow diagram of a method of manufacturing an optical engine, in accordance with the present systems, devices, and methods.

FIG. 5 is a flow diagram of a method 500 of manufacturing an optical engine, in accordance with the present systems, devices, and methods. The method 500 may be implemented to manufacture the optical engine 100 of FIGS. 1A-1B or the optical engine 312 of FIG. 3, for example. It should be appreciated that methods of manufacturing optical engines according to the present disclosure may include fewer or additional acts than set forth in the method 500. Further, the acts discussed below may be performed in an order different than the order presented herein.

At 502, a plurality of laser diodes may be bonded to a respective plurality of submounts. In at least some implementations, this method may be performed by an entity different than that manufacturing the optical engine. For example, in at least some implementations, one or more of the plurality of laser diodes (e.g., green laser diode, blue laser diode) may be purchased as already assembled laser CoSs. For ease of handling and simplification of the overall process, in at least some implementations it may be advantageous to also bond laser diodes that cannot be procured on submounts to a submount as well. As a non-limiting example, in at least some implementations, one or more of the laser diodes may be bonded to a corresponding submount using an eutectic gold tin (AuSn) solder process, which is flux-free and requires heating up top 280° C.

At 504, the plurality of CoSs may be bonded to a base substrate. Alternatively, act 502 could be skipped for at least one or all of the laser diodes, and act 504 could comprise bonding the at least one or all of the laser diodes directly to the base substrate. The base substrate may be formed from a material that is RF compatible and is suitable for hermetic sealing. For example, the base substrate may be formed from low temperature co-fired ceramic (LTCC), aluminum nitride (AlN), alumina, Kovar®, etc. Since several CoSs are bonded next to each other on the same base substrate, it may be advantageous to either "step-solder" them sequentially or to use a bonding technique that does not rely on re-melting of solder materials. For step-soldering, each subsequent soldering step utilizes a process temperature that is less than the process temperatures of previous solder steps to prevent re-melting of solder materials. It may also be important that the laser diode-to-submount bonding does not re-melt during bonding of the CoSS to the base substrate. Bonding technologies other than step-soldering that may be used include parallel soldering of all CoS in reflow oven process, thermosonic or thermocompression bonding, transient liquid phase (TLP) bonding, laser soldering, etc. Some of these example bonding technologies are discussed below.

For parallel soldering of all CoSs in a reflow oven process, appropriate tooling is required to assure proper bonding and alignment during the process. An advantage of this process is the parallel and hence time efficient bonding of all CoSs at once and even many assemblies in parallel. A possible disadvantage of this process is the potential loss of the alignment of components during the reflow process. Generally, a soldering cycle ideally needs a few minutes of dwell time. Preheating may be used to reduce the soldering time, which requires a few minutes for such a process depending on the thermal mass of the components being bonded. Thus, a batch process may be used with regular soldering to reduce the assembly costs with high throughput at the expense of alignment tolerance.

For thermosonic or thermocompression bonding, thick gold metallization may be used but no extra solder layer is required. The temperatures for thermocompression bonding might be as high as 300 to 350° C. to have a good bond with a good thermal conductivity. Thermosonic bonding may be used to reduce the pressure and temperature needed for bonding, which may be required for at least some components that might not tolerate the temperatures required for thermocompression bonding.

Transient liquid phase (TLP) bonding may also be used. There are many different reaction couples that may be used, including gold-tin, copper-tin, etc. With this method, a liquid phase is formed during the bonding which will solidify at the same temperature. The re-melting temperatures of the bond are much higher than the soldering temperatures.

In at least some implementations, laser soldering may be used to bond some or all of the components of the optical engine. Generally, the thermal characteristic of the parts to be bonded may be important when implementing a laser soldering process.

Subsequent reflows of solder are not recommended due to liquid phase reaction or dissolution mechanisms which may reduce the reliability of the joint. This could result in voiding at the interface or a reduction in strength of the joint itself. In order to mitigate potential reflow dissolution problems, other options can be taken into consideration, which do not rely on extreme heating of the device and can be favorable in terms of production cost. For example, bonding of the base substrate with adhesives (electrically conductive for common mass, or non-conductive for floating) may be acceptable with respect to heat transfer and out-gassing as discussed regarding partial hermetic sealing above.

Further, in at least some implementations, a reactive multi-layer foil material (e.g., NanoFoil®) or a similar material may be used as a solder pre-form, which enables localized heat transfer. A reactive multi-layer foil material is a metallic material based on a plurality (e.g., hundreds, thousands) of reactive foils (aluminum and nickel) that enables die-attach soldering (e.g., silicon chip onto stainless steel part). In such implementations, dedicated heat transfer support metallizations may be deposited onto the two components being joined together. This method may be more advantageous for CoS-to-base substrate mounting compared to chip-to-submount bonding. Generally, bonding using reactive multi-layer foil materials enables furnace-free, low-temperature soldering of transparent or non-transparent components, without reaching the bonding temperatures for solder reflow processes. Reactive multi-layer foil materials can be patterned with a ps-laser into exact preform shapes.

At 506, the optical director element, if included, may be bonded to the base substrate proximate the laser CoSs. The optical director element may be bonded to the base substrate using any suitable bonding process, including the bonding processes discussed above with reference to act 504.

At 507, the temperature sensors, and/or heaters, if included, may be bonded to the base substrate proximate the laser diodes or laser CoSs, or on the laser diodes or laser CoSs. The temperature sensors and/or heaters may be bonded to the base substrate, laser CoSs, or laser diodes using any suitable bonding process, including the bonding processes discussed above with reference to act 504.

Figure 8A:
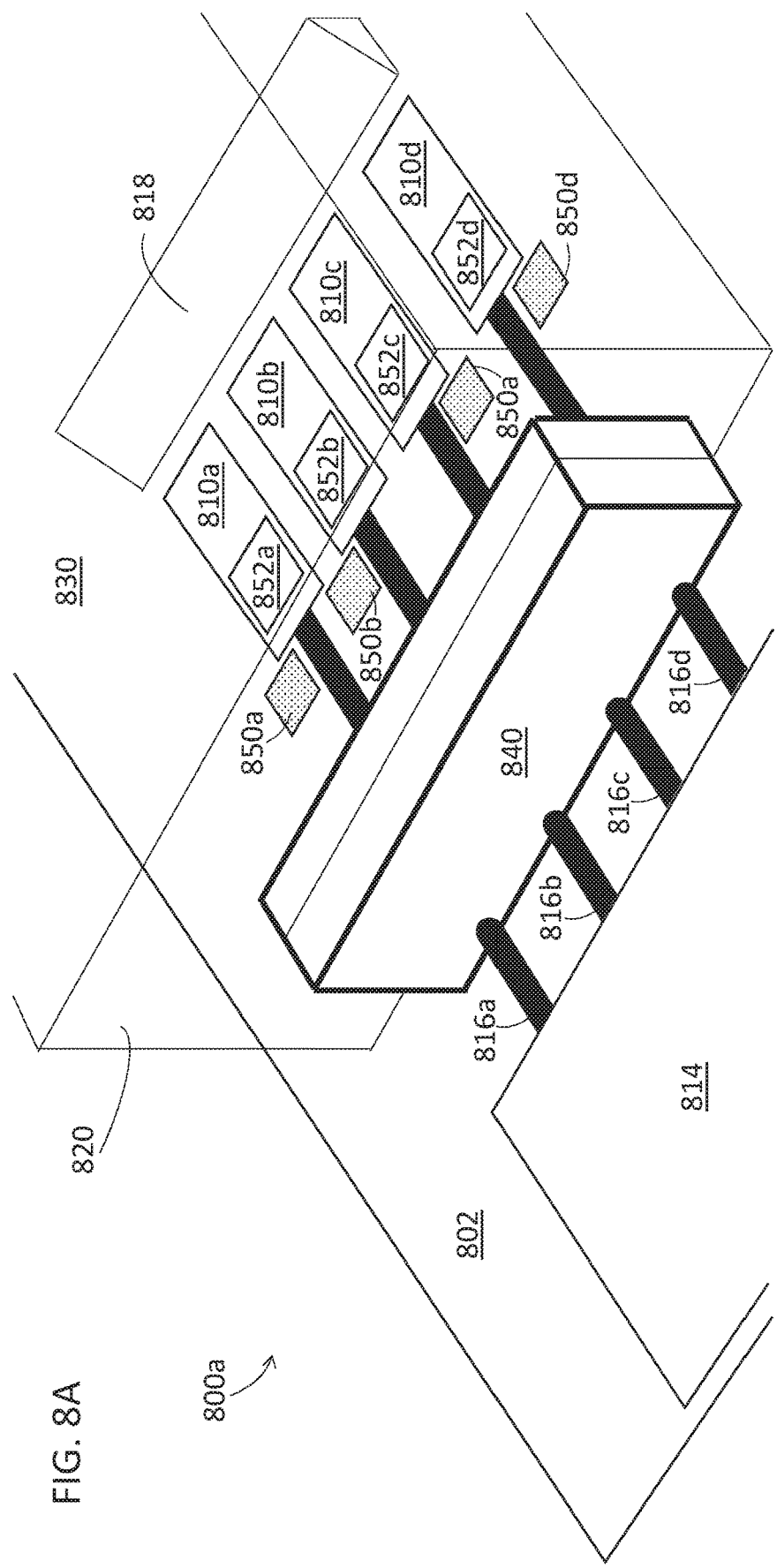
FIGS. 8A and 8B are isometric views of optical engines including an electrically insulating cover which prevents undesired electrical signal transmission from electrical connections, and showing implementations of optical engines having differing positions for a laser diode driver circuit in accordance with the present systems, devices, and methods.
Figure 8B:
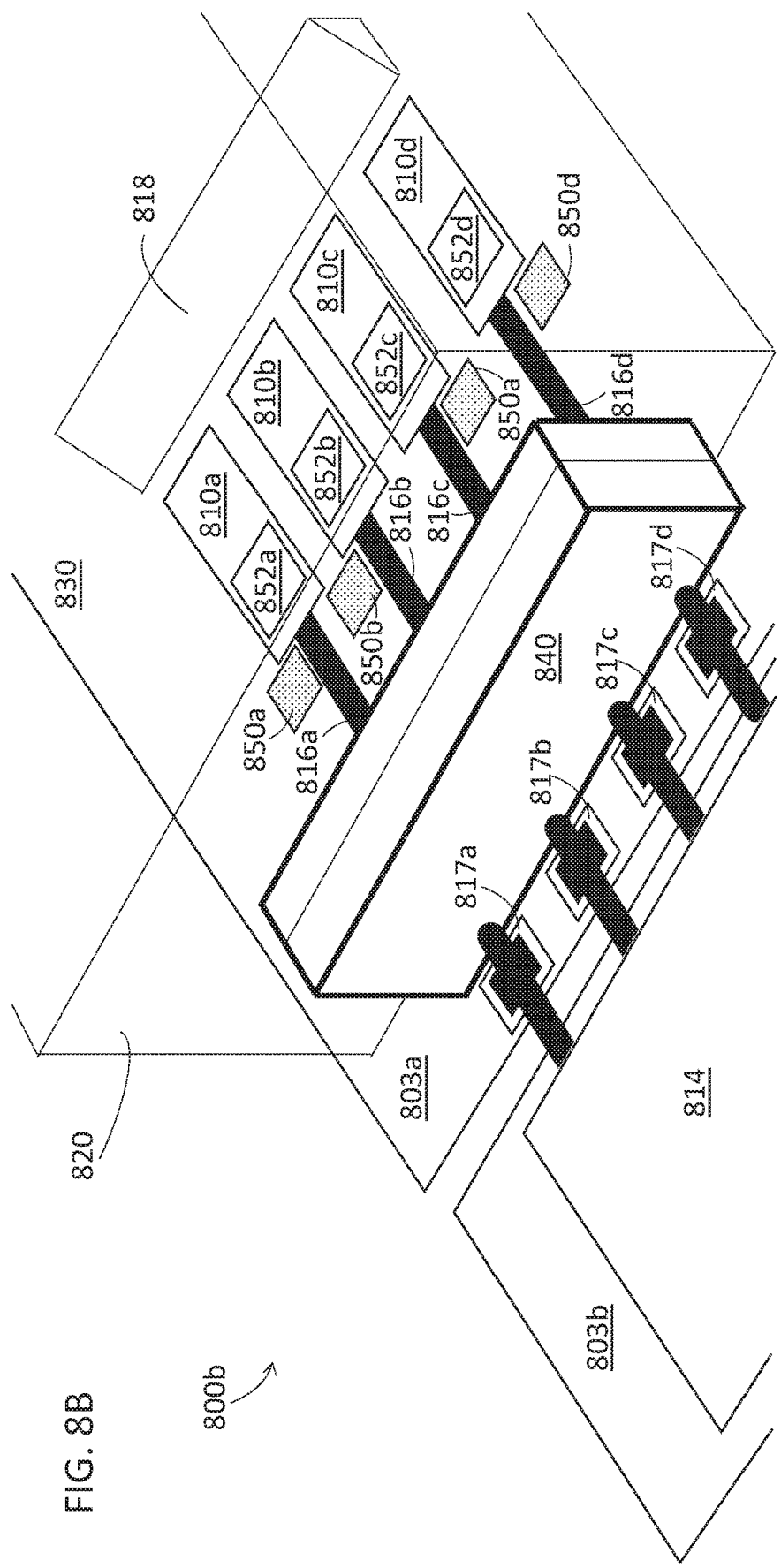

At 508, the laser diode driver circuit may optionally be bonded to the base substrate. As noted above, the laser diode driver circuit may be bonded to the base substrate such that the distance between the laser diode driver circuit and the laser CoSs is minimized. This may also comprise positioning a plurality of electrical connections which operatively couple the laser diode driver circuit to the plurality of laser diodes as shown in FIGS. 8A and 8B. In alternative implementations, the laser diode driver circuit may be bonded to a separate base substrate from the other components mentioned above as shown in FIG. 8B. The process used to bond the laser diode driver circuit to the base substrate may be any suitable bonding process, such as bonding processes commonly used to bond surface mount devices (SMD) to circuit boards. In other alternative implementations, the laser diode driver circuit may be mounted directly to a frame of a WHUD. For implementations where the laser diode drive circuit is not bonded to the same base substrate as the other components mentioned above, a plurality of electrical contacts and electrical connections could be bonded to the base substrate, each electrical connection operatively connecting a respective electrical contact to a respective laser diode. Subsequently, the at least one laser driver circuit could be operatively coupled to the electrical contacts, which will then electrically couple the laser diode drive circuit to the electrical connections and consequently to the laser diodes. Exemplary arrangements of electrical connections and electrical contacts is discussed later with reference to FIG. 8B.

At 510, the cap may optionally be bonded to the base substrate to form a hermetic or partially hermetic seal as discussed above between the interior volume of the encapsulated package and an exterior environment. As noted above, it may be desirable to maintain a specific atmosphere for the laser diode chips for reliability reasons. In at least some implementations, adhesive sealing may be undesirable because of the high permeability of gases. This is especially the case for blue laser diodes, which emit blue laser light that may bake contamination on facets and windows, thereby reducing transparency of the optical window. However, as detailed above regarding FIGS. 1A and 1B, partial hermeticity, a particulate dust cover, or even no protective cover may be acceptable for certain applications. In implementations where the cap would be bonded over electrical connections which connect the at least one laser diode driver circuit to the plurality of laser diodes, such as when the at least one laser diode driver circuit is bonded to the same side of a base substrate as the laser diodes, or when the at least one laser diode driver circuit is coupled to electrical contacts bonded to the same side of the base substrate as the laser diodes, an electrically insulating cover can first be bonded to the base substrate over the electrical connections. Subsequently, the cap can be bonded at least partially to the electrically insulating cover, and potentially to a portion of the base substrate if the insulating cover does not fully encircle the intended interior volume. In this way, at least a portion of the cap will be bonded to the base substrate indirectly by being bonded to the electrically insulating cover. In some implementations, the entire cap could be bonded to the base substrate indirectly by being bonded to an electrically insulating cover which encircles the intended interior volume. Exemplary electrically insulating covers are discussed later with reference to FIGS. 8A and 8B.

During the sealing process, the atmosphere may be defined by flooding the package accordingly. For example, the interior volume of the encapsulated package may be flooded with an oxygen enriched atmosphere that burns off contaminants which tend to form on interfaces where the laser beam is present. The sealing itself may also be performed so as to prevent the exchange between the package atmosphere and the environment. Due to limitations concerning the allowed sealing temperature, e.g., the components inside the package should not be influenced, in at least some implementations seam welding or laser assisted soldering/diffusion bonding may be used. In at least some implementations, localized sealing using a combination of seam welding and laser soldering may be used.

At 512, the collimation lenses may be actively aligned. For example, once the laser diode driver circuit has been bonded and the cap has been sealed, the laser diodes can be turned on and the collimations lenses for each laser diode can be actively aligned. In at least some implementations, each of the collimation lenses may be positioned to optimize spot as well as pointing for each of the respective laser diodes.

At 514, the beam combiner may be positioned to receive and combine individual laser beams into an aggregate beam. As discussed above, the beam combiner may include one or more diffractive optical elements and/or one or more refractive/reflective optical elements that function to combine the different color beams into an aggregate beam. The aggregate beam may be provided to other components or modules, such as a scan mirror of a laser projector, etc.

Figure 6:
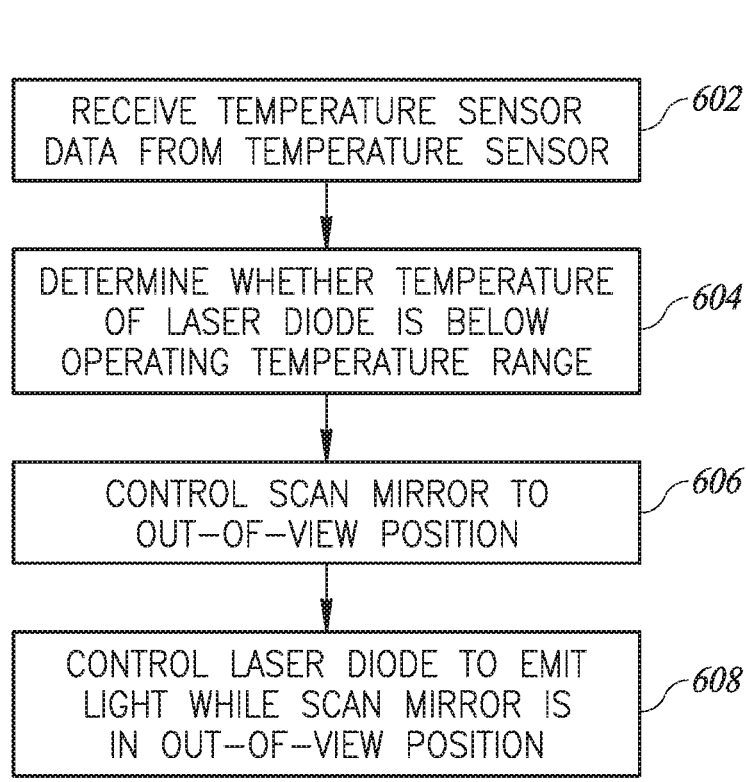
FIG. 6 is a flow diagram of a method of operating a wearable heads-up display, wherein laser diodes of the wearable heads-up display are selectively switched on to control their temperature to provide wavelength stabilization, in accordance with the present systems, devices, and methods.

FIG. 6 is a flow diagram of a method 600 of operating a wearable heads-up display, wherein laser diodes of the wearable heads-up display are selectively operated to control their temperature to provide wavelength stabilization, in accordance with the present systems, devices, and methods. The method 600 may be implemented using the optical engine 100 of FIGS. 1A-1B or the optical engine 312 of FIG. 3, for example. It should be appreciated that methods of operating wearable heads-up displays according to the present disclosure may include fewer or additional acts than set forth in the method 600. Further, the acts discussed below may be performed in an order different than the order presented herein.

At 602, at least one processor of the WHUD receives temperature sensor data (e.g., digital data, analog data) from at least one temperature sensor operative to sense the temperature of a laser diode of the WHUD. For example, the temperature sensor may be similar or identical to the temperature sensors 152 (FIG. 1A) and 340 (FIG. 3) discussed above. The at least one processor may receive temperature sensor data from the temperature sensor(s) at regular or irregular intervals.

At 604, the at least one processor may determine whether the temperature of the laser diode is below an operating temperature range. For example, the operating temperature range for a laser diode may be a temperature range wherein the laser diode has an acceptable amount of wavelength shift for a particular application. In at least some implementations, the operating temperature range is 50° C. to 70° C., for example.

At 606, responsive to a determination that the temperature of the laser diode is below the operating temperature range, the at least one processor may control the scan mirror to be in an out-of-view position wherein light emitted by the laser diode is redirected by the scan mirror to a position undetectable by the user. For example, the at least one processor may control the scan mirror to be outside of an eye box of the HMD. This may include controlling the scan mirror in an alternative mode where a single pixel (or a single row/column) is addressed, instead of the sweeping operation described above with reference to FIG. 3. For example, instead of sweeping across the display, the slow-axis mirror could be controlled to be continuously rotated at a high angle (possibly a maximum possible angle for the mirror), such that the slow-axis mirror will redirect light from the laser diode to be at (or beyond) a periphery of the normal projection area, and out-of-view of the user. Similarly, instead of oscillating back and forth across the display, the fast-axis mirror could be controlled to be continuously rotated at a high angle (possibly a maximum possible angle for the mirror), such that the fast-axis mirror will redirect light from the laser diode to be at (or beyond) a periphery of the normal projection area, and out-of-view of the user. This could for example involve the scan mirror(s) redirecting light from the laser diode to be at a top-left (or top-right, bottom-left, or bottom-right) corner of the projection limits of the mirror(s). Further, it may not be necessary for both scan mirrors to redirect light from the laser diode to an out-of-view position. Rather, only a single scan mirror may need to redirect the laser diode light out of view of the user, if said single mirror can redirect the laser diode light such that the laser diode light will be out of a field of view of the user regardless of the position of the other mirror. As an example, if an entire first row of pixels (e.g., one pixel scanned by the slow-axis mirror) is out of the field of view of the user, then the slow-axis mirror could be positioned to redirect the laser diode light to this first pixel row, and the position of the fast-axis mirror will not matter, because all pixels projected in the row will be out-of-view of the user. This concept could also be applied to the fast-axis mirror, where the fast-axis mirror can be rotated to a position where all of the laser light redirected thereby will be out-of-view of the user, regardless of the position of the slow mirror.

At 608, the at least one processor may control the laser diode to emit light (i.e., switch ON) while the scan mirror is positioned in the out-of-view position. This could include for example applying power to the laser diode, such as by closing a switch between a power supply and the laser diode, applying a signal to a transistor gate which will connect a power supply to the laser diode, applying a drive signal to the laser diode, increasing power of a drive signal applied to the laser diode such as by increasing width of a modulation drive signal (such as pulse width modulation) or increasing amplitude of a drive signal applied to the laser diode. Such causes the temperature of the laser diode to increase from a temperature below the operating temperature range to a temperature within the operating temperature range, thereby causing the laser diode to emit light at a wavelength that has an acceptable value. As an example, the at least one processor may cause the laser diode to emit light for a period of time until the temperature sensor subsequently senses that the operating temperature of the laser diode reaches a threshold temperature value that is within the operating temperature range. For instance, the threshold temperature value may be equal to an upper end of the operating range (e.g., a 70° C. threshold temperature value for an operating range of 50° C. to 70° C.). As another example, the threshold temperature value may be less than an upper end of the operating range (e.g., a 60° C. threshold temperature value for an operating range of 50° C. to 70° C.).

In at least some implementations, the at least one processor may alternatingly control the laser diode to emit light while the scan mirror is positioned in the out-of-view position and while the scan mirror is positioned in an in-view position wherein light emitted by the laser diode is redirected by the scan mirror to a position (e.g., inside the eye box) detectable by the user until the temperature of the laser diode reaches a threshold temperature value within the operating temperature range. Such feature may be beneficial during operation when the laser diode is being used to display images on the display, but such use alone is insufficient to raise the temperature of the laser diode to be within the determined operating temperature range.

Although not required, in at least some implementations the temperatures of each of a plurality of laser diodes may be independently controlled using the method 600 discussed above. For example, the temperature of each of a plurality of laser diodes be sensed, and each laser diode determined to be below the operating temperature range may be switched on while the scan mirror is in an out-of-view position until the laser diode is at a determined temperature within an operating temperature range. Additionally, in at least some implementations, the operating temperature ranges and/or threshold temperature values may be different for one or more of the laser diodes. As an example, for various reasons, a first laser diode may be permitted to operate over a different (e.g., higher, lower, wider, narrower) range of temperatures than a second laser diode, e.g., due to particular characteristics of the laser diodes, characteristics of other components of a system, characteristics of human vision, etc.

Figure 7:
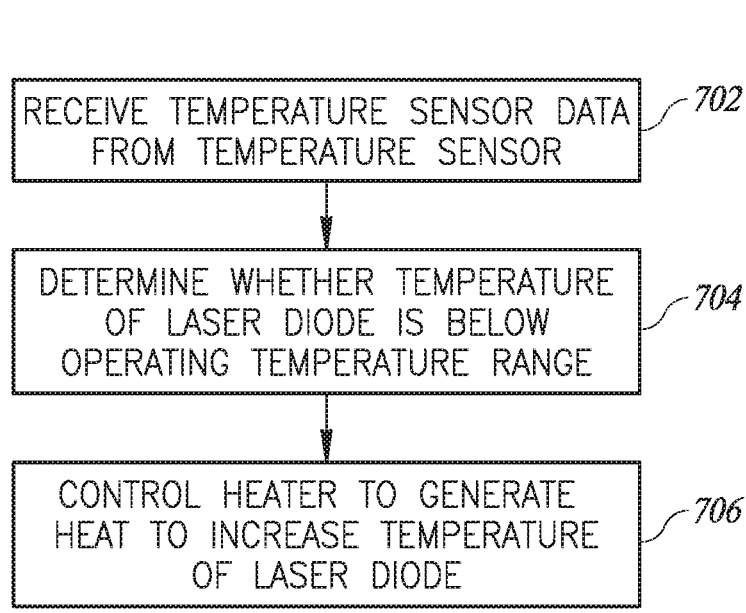
FIG. 7 is a flow diagram of a method of operating a wearable heads-up display, wherein heaters positioned proximate laser diodes of the wearable heads-up display are used to control the temperature of the laser diodes to provide wavelength stabilization, in accordance with the present systems, devices, and methods.

FIG. 7 is a flow diagram of a method 700 of operating a wearable heads-up display, wherein heaters positioned proximate laser diodes of the wearable heads-up display are used to control the temperature of the laser diodes to provide wavelength stabilization, in accordance with the present systems, devices, and methods. The method 700 may be implemented using the optical engine 100 of FIGS. 1A-1B or the optical engine 312 of FIG. 3, for example. It should be appreciated that methods of operating wearable heads-up displays according to the present disclosure may include fewer or additional acts than set forth in the method 700. Further, the acts discussed below may be performed in an order different than the order presented herein.

At 702, at least one processor of the WHUD receives temperature sensor data from at least one temperature sensor operative to sense the temperature of a laser diode of the WHUD. For example, the temperature sensor may be similar or identical to the temperature sensors 152 (FIG. 1A) and 340 (FIG. 3) discussed above. The at least one processor may receive temperature sensor data from the temperature sensor(s) at regular or irregular intervals.

At 704, the at least one processor may determine whether the temperature of the laser diode is below an operating temperature range. For example, the operating temperature range for a laser diode may be a temperature range wherein the laser diode has an acceptable amount of wavelength shift for a particular application. In at least some implementations, the operating temperature range is 50° C. to 70° C., for example.

At 706, responsive to a determination that the temperature of the laser diode is below the operating temperature range, the at least one processor may control a heater (e.g., compact resistive heater) positioned proximate the laser diode to generate heat, which increases the temperature of the laser diode from a temperature below the operating temperature range to a temperature that is within the operating temperature range. As discussed above, the heater may be bonded to a base substrate proximate the laser diode, bonded to a chip submount, etc.

By using the heater to increase the temperature of the laser diode into the operating temperature range, the laser diode emits light at a wavelength that has an acceptable value (i.e., within an acceptable range). As an example, the at least one processor may cause the heater to generate heat for a period of time until the temperature sensor subsequently senses that the operating temperature of the laser diode reaches a threshold temperature value that is within the operating temperature range. For instance, the threshold temperature value may be equal to an upper end of the operating range (e.g., a 70° C. threshold temperature value for an operating range of 50° C. to 70° C.). As another example, the threshold temperature value may be less than an upper end of the operating range (e.g., a 60° C. threshold temperature value for an operating range of 50° C. to 70° C.).

Although not required, in at least some implementations the temperatures of each of a plurality of laser diodes may be independently controlled using the method 700 discussed above. For example, the temperature of each of a plurality of laser diodes be sensed, and a heater proximate each laser diode determined to be below the operating temperature range may be switched on until the laser diodes is at a determined temperature. Additionally, in at least some implementations, the operating temperature ranges and/or threshold temperature values may be different for one or more of the laser diodes. As an example, a first laser diode may be permitted to operate over a different (e.g., higher, lower, wider, narrower) range of temperatures than a second laser diode.

FIGS. 8A and 8B are isometric views showing implementations of optical engines having differing positions for a laser diode driver circuit. The implementations shown in FIGS. 8A and 8B are similar in at least some respects to the implementations of FIGS. 1A, 1B, and 3, and one skilled in the art will appreciate that the description regarding FIGS. 1A, 1B, and 3 are applicable to the implementations of FIGS. 8A and 8B unless context clearly dictates otherwise.

FIG. 8A shows an optical engine 800a which includes a base substrate 802. The base substrate 802 may be formed from a material that is radio frequency (RF) compatible and is suitable for hermetic sealing. For example, the base substrate 802 may be formed from low temperature co-fired ceramic (LTCC), aluminum nitride (AlN), alumina, Kovar®, etc.

The optical engine 800a also includes a plurality of laser diodes aligned in a row across a width of the optical engine 800a, including an infrared laser diode 810a, a red laser diode 810b, a green laser diode 810c, and a blue laser diode 810d. In operation, the infrared laser diode 810a provides infrared laser light, the red laser diode 810b provides red laser light, the green laser diode 810c provides green laser light, and the blue laser diode 810d provides blue laser light. Each of the laser diodes may comprise one of an edge emitter laser or a vertical-cavity surface-emitting laser (VC-SEL), for example. In FIG. 8A, laser diodes 810a, 810b, 810c, and 810d are shown as being bonded (e.g., attached) directly to base substrate 802, as described above with regards to act 504 in FIG. 5, but one skilled in the art will appreciate that laser diodes 810a, 810b, 810c, and 810d could each be mounted on a respective submount, similar to as in FIGS. 1A and 1B.

The optical engine 800a also includes a laser diode driver circuit 814 which can be bonded to the same surface of base substrate 802 as the laser diodes 810a, 810b, 810c, 810d. In alternative implementations, laser diode driver circuit 814 can be bonded to a separate base substrate, such as in FIG. 8B discussed later. The laser diode driver circuit 814 is operatively coupled to the plurality of laser diodes 810a, 810b, 810c, and 810d via respective electrical connections 816a, 816b, 816c, 816d to selectively drive current to the plurality of laser diodes. In at least some implementations, the laser diode driver circuit 814 may be positioned relative to the laser diodes 810a, 810b, 810c, and 810d to minimize the distance between the laser diode driver circuit 814 and the laser diodes. Although not shown in FIG. 8A, the laser diode driver circuit 814 may be operatively coupleable to a controller (e.g., microcontroller, microprocessor, ASIC) which controls the operation of the laser diode driver circuit 814 to selectively modulate laser light emitted by the laser diodes 810a, 810b, 810c, and 810d. In at least some implementations, the laser diode driver circuit 814 may be bonded to another portion of the base substrate 802, such as the bottom surface of the base substrate 802. In at least some implementations, the laser diode driver circuitry 814 may be remotely located and operatively coupled to the laser diodes 810a, 810b, 810c, and 810d. In order to not require the use of impedance matched transmission lines, the size scale may be small compared to a wavelength (e.g., lumped element regime), where the electrical characteristics are described by (lumped) elements like resistance, inductance, and capacitance.

Proximate the laser diodes 810a, 810b, 810c, and 810d there is optionally positioned an optical director element 818. Like the laser diodes 810a, 810b, 810c, and 810d, the optical director element 818 is bonded to the top surface of the base substrate 802. The optical director element 818 may be bonded proximate to or adjacent each of the laser diodes 810a, 810b, 810c, and 810d. In the illustrated example, the optical director element 818 has a triangular prism shape that includes a plurality of planar faces, similar to optical director element 168 in FIGS. 1A and 1B. The optical director element 818 may comprise a mirror or a prism, for example.

Figure 9:
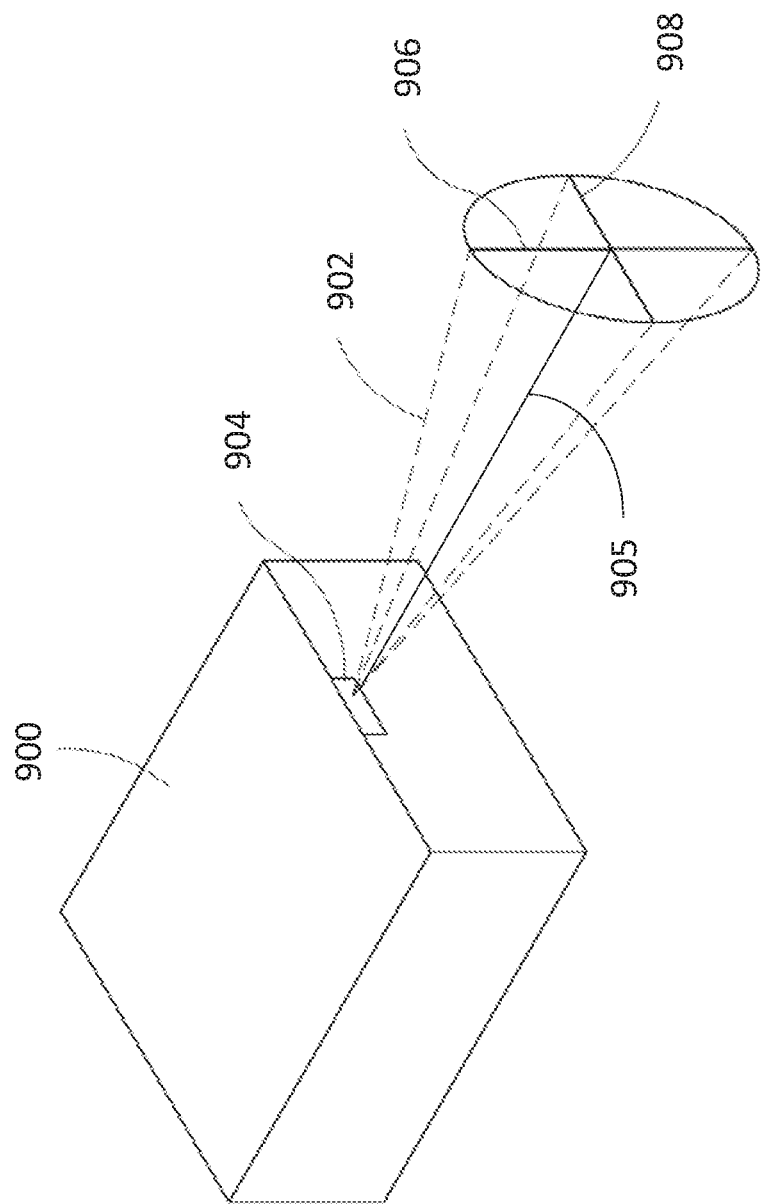
FIG. 9 is an isometric view of a laser diode, showing a fast axis and a slow axis of a light beam generated by the laser diode, in accordance with the present systems, devices, and methods.

The optical engine 800a also includes a cap 820 similar to cap 120 in FIGS. 1A and 1B or cap 920 in FIG. 9. For clarity, cap 820 is shown as being transparent in FIG. 8A, though this is not necessarily the case, and cap 820 can be at least partially formed of an opaque material. In the illustrated implementation, cap 820 can include a horizontal optical window 830 that forms the "top" of the cap 820. Although optical window 830 in FIG. 8A is shown as comprising the entire top of cap 820, in alternative implementations optical window could comprise only a portion of the top of cap 820. Cap 820 including optical window 830 defines an interior volume sized and dimensioned to receive the plurality of laser diodes 810a, 810b, 810c, 810d, and the optical director element 818. Cap 820 is bonded to the base substrate 802 to provide a hermetic or partially hermetic seal between the interior volume of the cap 820 and a volume exterior to the cap 820. The optical director element 818 is positioned and oriented to direct (e.g., reflect) laser light received from each of the plurality of laser diodes 810a, 810b, 810c, and 810d upward toward the optical window 830 of the cap 820, wherein the laser light exits the interior volume, similar to FIGS. 1A and 1B.

The cap 820 may have a round shape, rectangular shape, or other shape, similarly to as described regarding FIGS. 1A and 1B above. The optical window 830 may comprise an entire top of the cap 820, or may comprise only a portion thereof. In alternative implementations, optical window 830 could be positioned on a side of cap 820 to allow beams of light from laser diodes 810a, 810b, 810c, and 810d to exit the cap through a side portion thereof. In such an implementation, each of laser diodes 810a, 810b, 810c, and 810d can be a side-emitting laser, and optical engine 800a may not include optical redirector element 818.

In at least some implementations, the cap 820 may include a plurality of optical windows instead of a single optical window.

The optical engine 800a can also include four collimation/pointing lenses similarly to as discussed regarding FIGS. 1A and 1B above. Each of the collimation lenses can be operative to receive laser light from a respective one of the laser diodes 810a, 810b, 810c, or 810d, and to generate a single color beam.

The optical engine 800a may also include, or may be positioned proximate to, a beam combiner that is positioned and oriented to combine the light beams received from each of the collimation lenses or laser diodes 810a, 810b, 810c, or 810d into a single aggregate beam. As an example, the beam combiner may include one or more diffractive optical elements (DOE) and/or one or more refractive/reflective optical elements that combine the different color beams in order to achieve coaxial superposition. Exemplary beam combiners are shown and discussed with reference to FIG. 3.

In at least some implementations, the laser diodes 810a, 810b, 810c, 810d, the optical director element 818, and/or the collimation lenses may be positioned differently. As noted above, laser diode driver circuit 814 may be mounted on a top surface or a bottom surface of the base substrate 802, depending on the RF design and other constraints (e.g., package size). In at least some implementations, the optical engine 800a may not include the optical director element 818, and the laser light may be directed from the laser diodes 810a, 810b, 810c, and 810d toward collimation lenses without requiring an intermediate optical director element. Additionally, in at least some implementations, one or more of the laser diodes may be mounted indirectly on the base substrate 802 with a submount.

Optical engine 800a in FIG. 8A also includes an electrically insulating cover 840. In FIG. 8A, laser diodes 810a, 810b, 810c, and 810d are each connected to laser diode driver circuitry 814 by a respective electrical connection 816a, 816b, 816c, or 816d positioned as described above with regards to act 508 in FIG. 5. Electrical connections 816a, 816b, 816c, and 816d run across a surface of the base substrate 802. As described above with regards to act 510 in FIG. 5, electrically insulating cover 840 is placed, adhered, formed, or otherwise positioned over electrical connections 816a, 816b, 816c, and 816d, such that each of the electrical connections 816a, 816b, 816c, and 816d run through electrically insulating cover 840. Also as described above with regards to act 510 in FIG. 5, cap 820 is placed, adhered, formed, or otherwise positioned over electrically insulating cover 840, such that cap 820 does not contact any of the electrical connections 816a, 816b, 816c, or 816d. For clarity, cap 820 is shown as being transparent in FIG. 8A, though this is not necessarily the case, and cap 820 can be at least partially formed of an opaque material. Electrically insulating cover 840 can be formed of a material with low electrical permittivity such as a ceramic, such that electrical signals which run through electrical connections 816a, 816b, 816c, and 816d do not run into or through electrically insulating cover 840. In this way, electrical signals which run through electrical connections 816a, 816b, 816c, and 816d can be prevented from running into or through cap 820, which can be formed of an electrically conductive material. Although FIG. 8A shows electrically insulating cover 840 as extending along only part of a side of cap 820, one skilled in the art will appreciate that electrically insulating cover 840 can extend along an entire side length of cap 820.

One skilled in the art will appreciate that the positions of laser diode driver circuitry 814, electrical connections 816a, 816b, 816c, 816d, and electrically insulating cover 840 as shown in FIG. 8A could also be applied in other implementations of the subject systems, devices and methods. For example, in the implementations of FIGS. 1A and 1B, laser diode driver circuitry 114 could be positioned on top surface 104 of base substrate 102, and electrical connections 116 could run across top surface 104 under an electrically insulating cover, such that electrical connections 116 do not contact any conductive portion of cap 120.

Optical engine 800a in FIG. 8A also includes temperature sensors 852a, 852b, 852c, and 852d positioned on respective laser diodes 810a, 810b, 810c, and 810d. Optionally, the temperature sensors could be positioned adjacent to the respective laser diodes, or could be positioned on a respective submount on which a respective laser diode is mounted. Each temperature sensor could be used to sense the temperature of a respective laser diode, for temperature control techniques such as those described with reference to FIGS. 6 and 7. Although not explicitly illustrated in FIG. 8A, each temperature sensor could be connected to a temperature monitoring circuit and/or processor by electrical connections which run through base substrate 802, or by electrical connections which run through insulating cover 840, similar to electrical connections 816a, 816b, 816c, 816d. Such a temperature monitoring circuit and/or processor could be mounted directly to the top or bottom of base substrate 802, or could be separate from base substrate 802 as discussed in more detail with reference to FIG. 8B below.

Optical engine 800a as shown in FIG. 8A also includes heaters 850a, 850b, 850c, and 850d bonded adjacent respective laser diodes 810a, 810b, 810c, and 810d. The inclusion of heaters 850a, 850b, 850c, and 850d is optional. Further, the heaters could optionally be positioned on the respective laser diodes, or could be positioned on a respective submount on which a respective laser diode is mounted. Each heater can be used to adjust the temperature of a respective laser diode in response to temperature of the laser diode detected by a respective temperature sensor, as discussed above with regards to FIG. 7. Although not explicitly illustrated in FIG. 8A, each heater could be connected to a power supply by electrical connections which run through base substrate 802, or by electrical connections which run through insulating cover 840, similar to electrical connection 816a, 816b, 816c, 816d. Such a power supply could be controlled by the temperature monitoring circuit and/or processor above to supply an appropriate amount of power to a respective heater to warm the respective laser diode to the correct temperature. Such a power supply could be mounted directly to the top or bottom of base substrate 802, or could be separate from base substrate 802 as discussed in more detail with reference to FIG. 8B below.

FIG. 8B is an isometric view an optical engine 800b similar in at least some respects to optical engine 800a of FIG. 8A. One skilled in the art will appreciate that the description of optical engine 800a in FIG. 8A is applicable to optical engine 800b in FIG. 8B, unless context clearly dictates otherwise. The optical engine 800b includes a base substrate 803a. Similar to base substrate 802 in FIG. 8A, base substrate 803a may be formed from a material that is radio frequency (RF) compatible and is suitable for hermetic sealing. For example, the base substrate 803a may be formed from low temperature co-fired ceramic (LTCC), alumina, Kovar®, etc.

One difference between optical engine 800b in FIG. 8B and optical engine 800a in FIG. 8A relates to what components are bonded (e.g. attached) to base substrate 803a. In optical engine 800b, each of: laser diodes 810a, 810b, 810c, 810d; cap 820; electrical connections 816a, 816b, 816c, 816d; electrically insulating cover 840, and optional heaters 850a, 850b, 850c, and 850d are bonded (e.g., attached) to base substrate 803a. Although temperature sensors 852a, 852b, 852c, and 852d are each shown as being bonded to a respective one of laser diodes 810a, 810b, 810c, and 810d, the temperature sensors could optionally be bonded to base substrate 803a adjacent to the respective laser diodes, or could optionally be positioned on a respective submount on which a respective laser diode is mounted. Further, the heaters could optionally be positioned on the respective laser diodes, or could be positioned on a respective submount on which a respective laser diode is mounted.

Laser diode driver circuit 814 is not necessarily bonded directly to base substrate 803a. Instead, laser diode driver circuit 814 could be bonded to a separate base substrate 803b. Similar to base substrate 802 in FIG. 8A and base substrate 803a in FIG. 8B, base substrate 803b may be formed from a material that is radio frequency (RF) compatible and is suitable for hermetic sealing. For example, the base substrate 803b may be formed from low temperature co-fired ceramic (LTCC), alumina, Kovar®, etc. In an alternative implementation, laser diode drive circuit 814 may not need to be bonded to a substrate at all, and could simply be mounted directly to a frame of a WHUD.

For implementations where laser diode driver circuit 814 is not bonded to base substrate 803a, electrical contacts 817a, 817b, 817c, and 817d could be bonded to base substrate 803a, each at an end of a respective electrical connection 816a, 816b, 816c, or 816d as described above with regards to act 508 in FIG. 5. In this way, electrical contacts 817a, 817b, 817c, and 817d could be used to electrically couple laser diode drive circuit 814 to electrical connections 816a, 816b, 816c, and 816d and consequently laser diodes 810a, 810b, 810c, and 810d.

Similarly to laser diode driver circuit 814, although not explicitly illustrated in FIG. 8B to reduce clutter, a temperature monitoring circuit and/or processor coupled to temperature sensors 852a, 852b, 852c, and 852d does not necessarily need to be bonded directly to base substrate 803a. Instead, the temperature monitoring circuit and/or processor could be bonded to a separate base substrate. In an alternative implementation, the temperature monitoring circuit and/or processor may not need to be bonded to a substrate at all, and could simply be mounted directly to a frame of a WHUD. For implementations where the temperature monitoring circuit and/or processor is not bonded to base substrate 803a, each of the temperature sensors 852a, 852b, 852c, and 852d could be coupled to a respective electrical contact bonded to base substrate 803a by a respective electrical connection, similar to electrical connections 817a, 817b, 817c, and 817d. The temperature monitoring circuit and/or processor could then be coupled to the temperature sensors 852a, 852b, 852c, and 852d indirectly via the electrical contacts.

Similarly to laser diode driver circuit 814, although not explicitly illustrated in FIG. 8B to reduce clutter, a power supply coupled to heaters 850a, 850b, 850c, and 850d does not necessarily need to be bonded directly to base substrate 803a. Instead, the power supply could be bonded to a separate base substrate. In an alternative implementation, the power supply may not need to be bonded to a substrate at all, and could simply be mounted directly to a frame of a WHUD. For implementations where the power supply is not bonded to base substrate 803a, each of the heaters 850a, 850b, 850c, and 850d could be coupled to a respective electrical contact bonded to base substrate 803a by a respective electrical connection, similar to electrical connections 817a, 817b, 817c, and 817d. The power supply could then be coupled to the heaters 850a, 850b, 850c, and 850d indirectly via the electrical contacts.

Although the implementations of FIGS. 8A and 8B illustrate examples which include cap 820, cap 820 could be replaced by a waveguide and sealing medium. The waveguide and sealing medium can be transparent to wavelengths of light emitted by each of the laser diodes 810a, 810b, 810c, and 810d, to allow light from the laser diodes to pass through.

For example, a waveguide and sealing medium could be disposed on base substrate 802 in FIG. 8A to cover the plurality of laser diodes 810a, 810b, 810c, and 810d; optical director element 818 (if included); and at least a portion or all of electrical connections 816a, 816b, 816c, and 816d. Laser diode driver circuitry 814 could optionally be covered as well, or left uncovered. In this way, electrical connections 816a, 816b, 816c, and 816d will connect laser diode circuitry 814 to laser diodes 810a, 810b, 810c, and 810d through the waveguide and sealing medium.

As another example, a waveguide and sealing medium could be disposed on base substrate 803a in FIG. 8B to cover the plurality of laser diodes 810a, 810b, 810c, and 810d; optical director element 818 (if included); and a portion of electrical connections 816a, 816b, 816c, and 816d. Electrical contacts 817a, 817b, 817c, and 817d could be left uncovered, such that laser diode circuitry 814 can be coupled thereto. In this way, electrical connections 816a, 816b, 816c, and 816d will connect laser diode circuitry 814 to laser diodes 810a, 810b, 810c, and 810d via electrical contacts 817a, 817b, 817c, and 817d, through the waveguide and sealing medium.

Throughout this application, collimation lenses have been represented in the Figures by a simple curved lens shape. However, the subject systems, devices, and methods can utilize more advanced collimation schemes, as appropriate for a given application.

FIG. 9 shows an exemplary situation where using an advanced collimation scheme would be helpful. FIG. 9 is an isometric view of a laser diode 900. The laser diode 900 may be similar or identical to the various laser diodes discussed herein. The laser diode 900 outputs a laser light beam 902 via an output facet 904 of the laser diode generally along a propagation axis 905. FIG. 9 shows the divergence of the light 902 emitting from the laser diode 900. As shown, the light beam 902 may diverge by a substantial amount in the direction of a fast axis 906 and by a lesser amount in a slow axis 908. Propagation axis 905, fast axis 906, and slow axis 908 can be orthogonal to each other. As a non-limiting example, in at least some implementations, the light beam 902 may diverge with full width half maximum (FWHM)

angles of up to 40 degrees in the fast axis direction 906 and up to 10 degrees in the slow axis direction 908. This divergence results in a rapidly expanding elliptical cone.

Figure 10A:
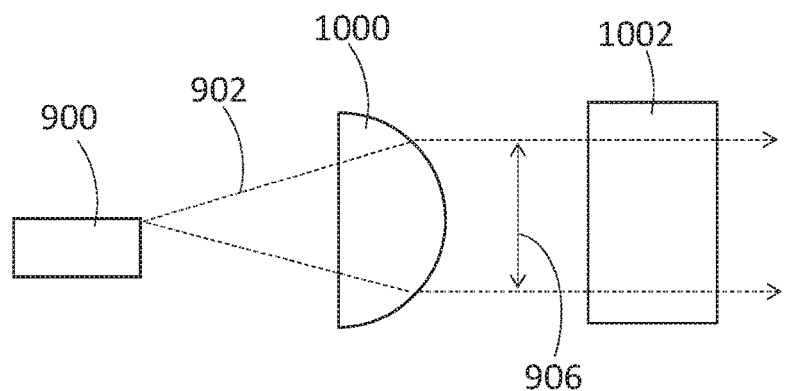
FIG. 10A is a left side sectional view of a laser diode and a set of collimation lenses for collimating a beam of light separately in the direction of different axes.
Figure 10B:
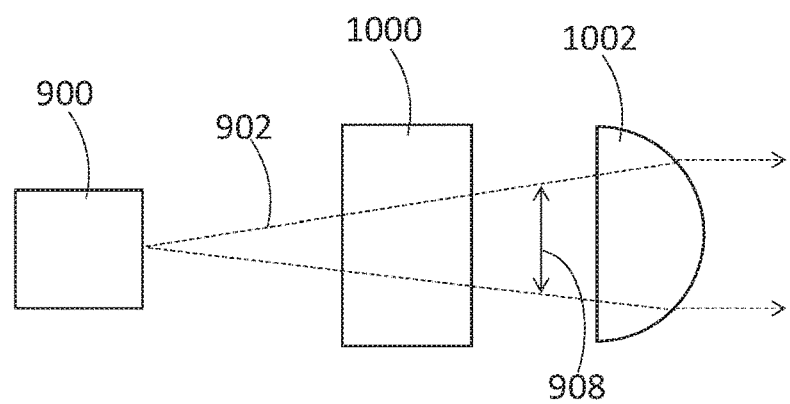
FIG. 10B is a top side sectional elevational view of the laser diode and the set of collimation lenses of FIG. 10A.

FIGS. 10A and 10B show an exemplary collimation scheme that can be used to circularize and collimate an elliptical beam such as that shown in FIG. 9. FIG. 10A illustrates an orthogonal view of the fast axis 906 of light beam 902 emitted from laser diode 900. FIG. 10B illustrates an orthogonal view of the slow axis 908 of light beam 902 emitted from laser diode 900. To reduce clutter, propagation axis 905 is not shown in FIGS. 10A and 10B, but can be generally in the direction of propagation of light beam 902 as in FIG. 9. As shown in FIG. 10A, a first lens 1000 collimates light beam 902 with respect to fast axis 906. As shown in FIG. 10B, first lens 1000 is shaped so as to not substantially influence light beam 902 in the direction of slow axis 908. Subsequently, as shown in FIG. 10B, light beam 902 is collimated with respect to slow axis 908 by a second lens 1002. As shown in FIG. 10A, second lens 1002 is shaped so as to not substantially influence light beam 902 in the direction of fast axis 906. In essence, light beam 902 is collimated with respect to fast axis 906 separately from slow axis 908. By collimating light beam 902 with respect to fast axis 906 separately from slow axis 908, the collimation power applied to each axis can be independently controlled by controlling the power of lens 1000 and lens 1002 separately. Further, spacing between each of laser diode 900, lens 1000, and lens 1002 can be controlled to collimate light beam 902 to a certain width in each axis separately. If light beam 902 is collimated with respect to fast axis 906 to the same width as slow axis 908, light beam 902 can be circularized. Because light beam 902 will typically diverge faster in the fast axis 906, it is generally preferable to collimate light beam 902 with respect to fast axis 906 first, then collimate light beam 902 with respect to slow axis 908 after. However, it is possible in certain applications to collimate light beam 902 with respect to slow axis 908 first, and subsequently collimate light beam 902 with respect to fast axis 906 after. This can be achieved by reversing the order of first lens 1000 with second lens 1002, with respect to the path of travel of light beam 902.

Figure 10C:
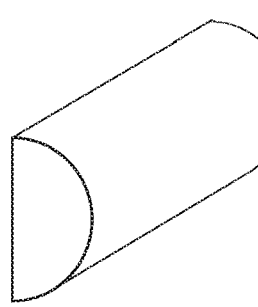
FIGS. 10C and 10D are isometric views of exemplary lens shapes which could be used as lenses in the implementation of FIGS. 10A and 10B.
Figure 10D:
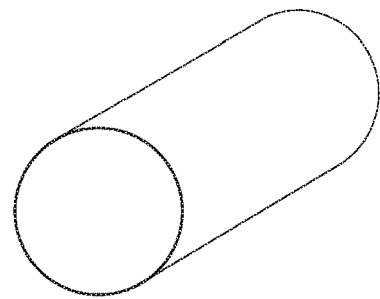

FIGS. 10C and 10D are isometric views which illustrate exemplary shapes for lenses 1000 and 1002. Each of lens 1000 and 1002 can be for example a half-cylinder as in FIG. 10C, a full cylinder as in FIG. 10D, a quarter cylinder, a three-quarter cylinder, any other partial cylinder, or any other appropriate shape. Lenses 1000 and 1002 can be similarly shaped, or can have different shapes.

FIGS. 11A and 11B illustrate an alternative collimation scheme. FIG. 11A illustrates an orthogonal view of the fast axis 906 of light beam 902 emitted from laser diode 900. FIG. 11B illustrates an orthogonal view of the slow axis 908 of light beam 902 emitted from laser diode 900. To reduce clutter, propagation axis 905 is not shown in FIGS. 11A and 11B, but can be generally in the principal direction of propagation of light beam 902 as in FIG. 9. As shown in FIG. 11A, a first lens 1100 redirects light beam 902 with respect to fast axis 906, to reduce divergence of light beam 902 in the direction of fast axis 906. As shown in FIG. 11B, first lens 1100 is shaped so as to not substantially influence light beam 902 in the direction of slow axis 908. Preferably, first lens 1100 will reduce divergence of light beam 902 with respect to fast axis 906 to match divergence of light beam 902 with respect to slow axis 908. That is, first lens 1100 preferably circularizes light beam 902. Subsequently, as shown in FIGS. 11A and 11B, light beam 902 is collimated with respect to both fast axis 906 and slow axis 908 by a second lens 1102. As shown in FIGS. 11A and 11B, second lens 1102 is shaped similarly with respect to both the fast axis 906 and the slow axis 908, to evenly collimate light beam 902. In essence, first lens 1100 circularizes light beam 902, and subsequently second lens 1102 collimates light beam 902 with respect to both axes. First lens 1100 can for example be shaped similarly to lens 1000 or lens 1002 discussed above, and shown in FIGS. 10C and 10D. Second lens 1102 can for example be shaped as a double convex lens as illustrated in FIG. 11C, or a single convex lens (convex on either side) as illustrated in FIG. 11D, or any other appropriate shape of collimating lens.

The collimation schemes illustrated in FIGS. 10A-10D and 11A-11D, and discussed above could be used in place of any of the collimation lenses described herein, including at least collimation lenses 136a, 136b, 136c, 136d.

Figure 12A:
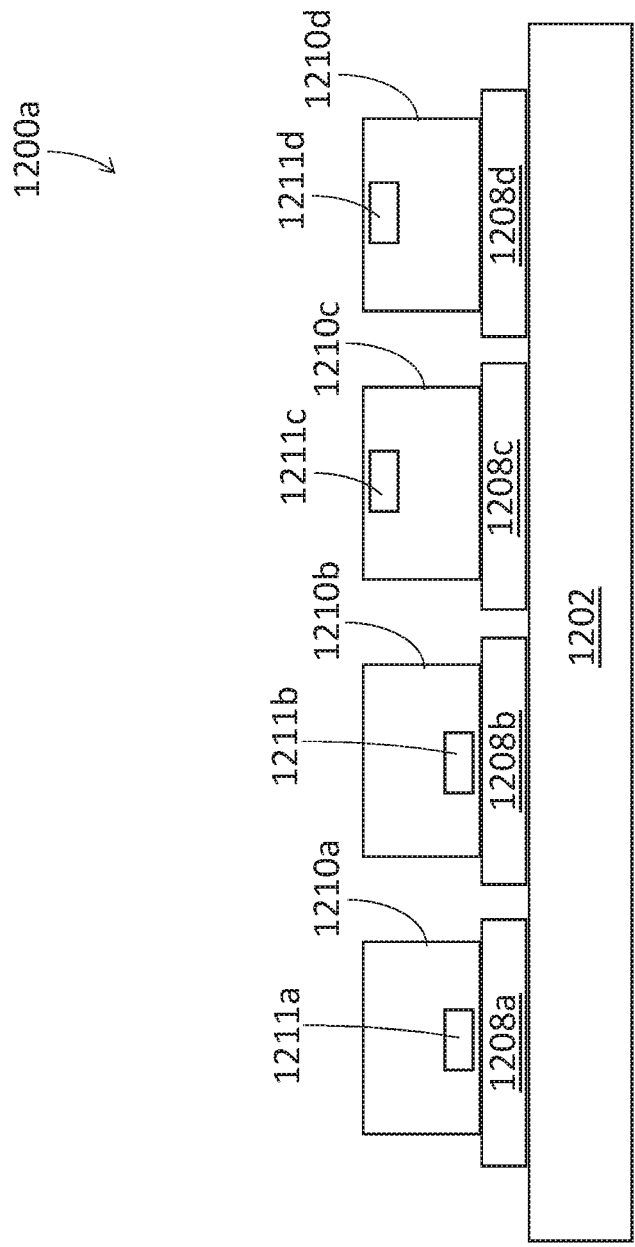
FIG. 12A is a front view of an optical engine having output facets of laser diodes being in different planes.

In addition to collimation, optics can also be included to adjust light beam trajectory. In this regard, FIG. 12A is a front view of an optical engine 1200a. The descriptions of all of the optical engines above, including at least the descriptions related to FIGS. 1A, 1B, 3, 8A, and 8B above can be applicable to optical engine 1200a, and thus will not be repeated in the interests of brevity. Further, although not explicitly illustrated in FIG. 12A, optical engine 1200a can include several features of the optical engines discussed herein, such as a cap, an optical window in said cap, a laser diode driver circuit, an electrically insulating cover, an optical redirector element, temperature sensors, heaters, collimation lenses, and any other appropriate element of the optical engines described herein. Such additional features are not explicitly shown in FIG. 12A in order to avoid obscuring the features of FIG. 12A discussed below.

FIG. 12A shows a base substrate 1202, having a plurality of submounts 1208a, 1208b, 1208c, 1208d bonded thereon, each submount having a respective laser diode 1210a, 1210b, 1210c, or 1210d bonded thereon. Each laser diode can be bonded to a respective submount using any of the processes described with reference to FIG. 5. Each submount can be bonded to the base substrate 1202 using any of the processes described with reference to FIG. 5. Alternatively, each laser diode may be bonded directly to base substrate 1202 without a submount using any of the processes described with reference to FIG. 5.

Laser diode 1210a can be an infrared laser diode which in operation provides infrared laser light from an output facet 1211a; laser diode 1210b can be a red laser diode which in operation provides red laser light from an output facet 1211b; laser diode 1210c can be a green laser diode which in operation provides green laser light from an output facet 1211c; and laser diode 1210d can be a blue laser diode which in operation provides blue laser light from an output facet 1211d. Each of the laser diodes may comprise one of an edge emitter laser or a vertical-cavity surface-emitting laser (VCSEL), for example. In FIG. 12A, laser diodes 1210a and 1210b are shown in an upside-down orientation compared to laser diodes 1210c and 1210d. That is, laser diodes 1210a and 1210b are oriented with the p-side down towards base substrate 1202, and laser diodes 1210c and 1210d are oriented with the p-side up away from base substrate 1202. At least one reason for such an arrangement is that red and infrared lasers are sensitive to heat generated by the laser. If the red and infrared laser diodes are placed p-side up, heat will dissipate through the laser diode into the base substrate, which negatively impacts temperature control of the laser diode. If the red and infrared laser diodes are placed p-side down as in FIG. 12A, heat dissipation is improved by allowing heat to dissipate directly into the base substrate. It is within the scope of the present systems, devices, and methods for any of the laser diodes to be mounted to the base substrate 1202 indirectly or directly in the p-side up configuration or in the p-side down configuration.

Having some laser diodes in an upside-down orientation compared to other laser diodes can create a non-alignment of the output facets of each diode, such that all of the output facets do not lie in a common plane as is evident in FIG. 12A. This non-alignment can be addressed in a number of ways discussed below.

Figure 12B:
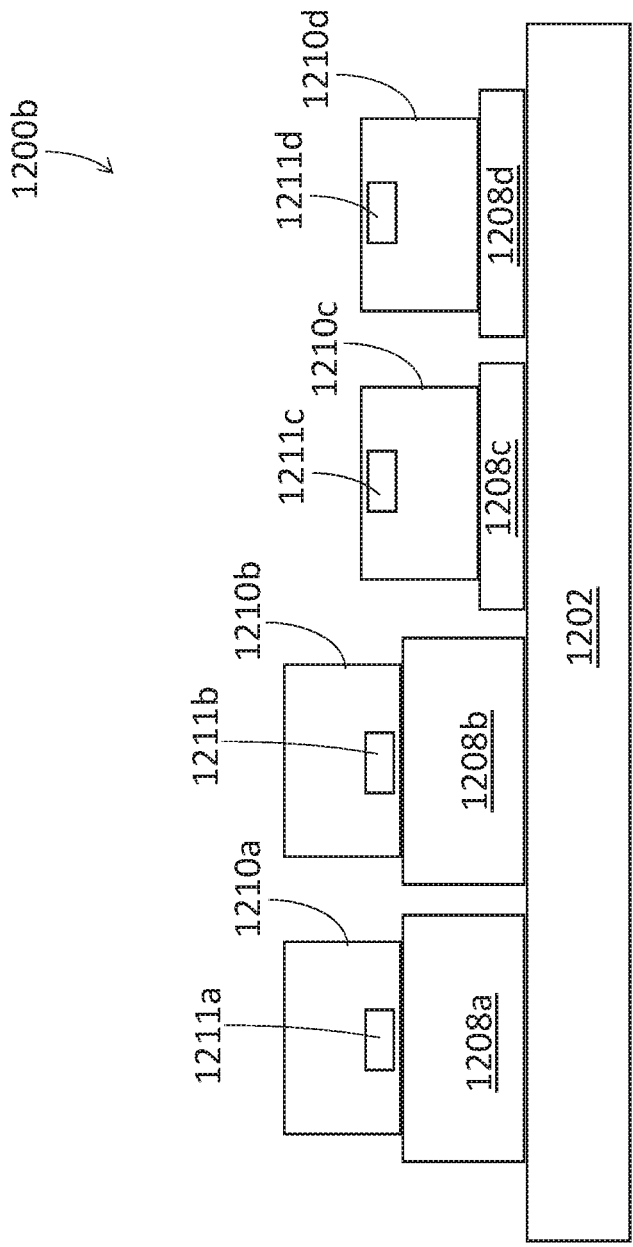
FIG. 12B is a front view of an optical engine having output facets of laser diodes being in a common plane.

As one example, FIG. 12B is a front view of an optical engine 1200b, which is similar in at least some respects to optical engine 1200a of FIG. 12A, such that the description of optical engine 1200a can be applicable to optical engine 1200b. One difference between optical engine 1200b and optical engine 1200a is that in optical engine 1200b, laser diodes 1210a and 1210b are mounted on a thicker submount than the other laser diodes. In this way, laser diodes 1210a and 1210b can be spaced from base substrate 1202 an appropriate distance such that output facets 1211a, 1211b, 1211c, and 1211d are aligned in a common plane.

As another example, optics can be used to shift the beam from at least one of the laser diodes such that the output light beams are aligned in a common plane, even if all of the output facets are not aligned. Further, since many of the described optical engines already include collimation optics such as those of FIGS. 10A-10D and 11A-11D, it would be advantageous to save space by implementing combined optical systems which collimate and/or circularize the light beam output from at least one of the laser diodes, as well as shift the light beam output. FIGS. 13A-13C and 14A-14C show examples of such combined collimation and beam-shifting optical systems.

Figure 13A:
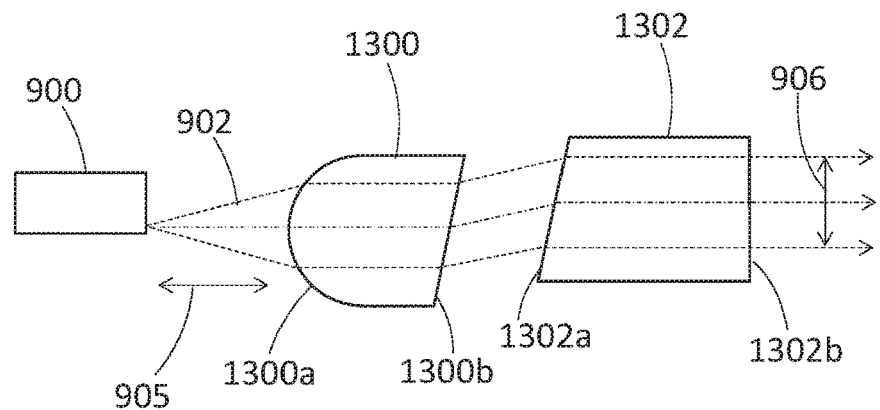
FIG. 13A is a left side sectional view of an optical system including a laser diode and a set of combined collimation and beam-shifting lenses for circularizing, collimating, and shifting a beam of light.
Figure 13B:
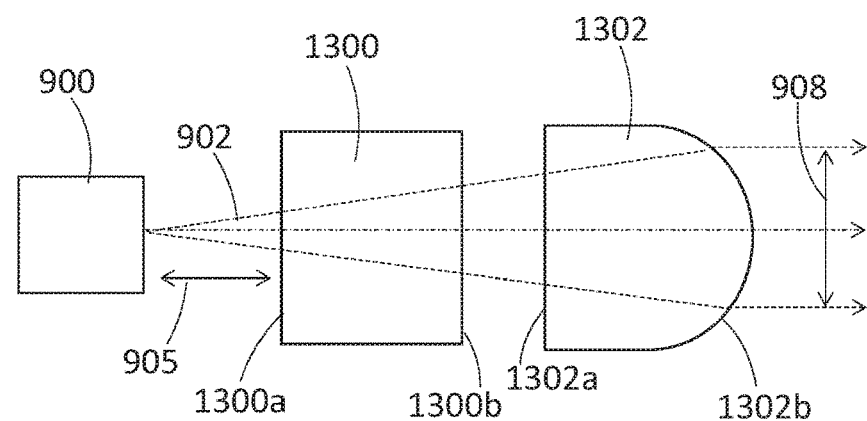
FIG. 13B is a top side sectional view of the optical system of FIG. 13B.
Figure 13C:
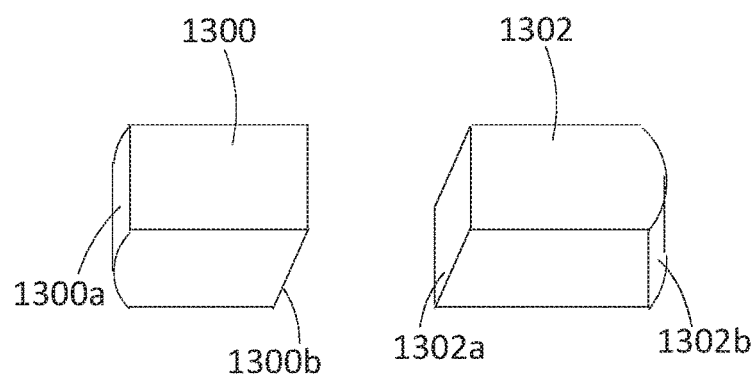
FIG. 13C is an isometric view of exemplary lens shapes which could be used in the implementation of FIGS. 13A and 13B.

FIGS. 13A-13C show an exemplary optical system that can be used to circularize and collimate an elliptical beam such as that shown in FIG. 9, as well as shift the trajectory of the beam. FIG. 13A illustrates an orthogonal view of the fast axis 906 of light beam 902 emitted from laser diode 900. FIG. 13B illustrates an orthogonal view of the slow axis 908 of light beam 902 emitted from laser diode 900. Propagation axis 905 lies generally in the direction of propagation of beam of light 902. As shown in FIG. 13A, a first input face 1300a of first lens 1300 collimates light beam 902 with respect to fast axis 906. To achieve this, first input face 1300a of lens 1300 can have a convex shape with respect to fast axis 906. As shown in FIG. 13B, the first input face 1300a of first lens 1300 is shaped to not substantially influence light beam 902 in the direction of slow axis 908. To achieve this, first input face 1300a can have a straight shape with respect to slow axis 908 (i.e., first input face 1300a is parallel with slow axis 908). Consequently, first input face 1300a can have a partially cylindrical shape or arcuate shape, where the length of the partial cylinder extends parallel to the slow axis 908 of light beam 902. Stated differently, the curvature of the partial cylinder can curve around an axis of curvature that is parallel to slow axis 908.

Subsequently, a first output face 1300b of first lens 1300 can redirect light beam 902 to project out of first lens 1300 at a non-zero angle with respect to the propagation axis 905. To achieve this, first output face 1300b can be tilted or angled at a non-zero angle with respect to fast axis 906 (i.e., first output face 1300b is non-parallel with fast axis 906).

Subsequently, a second input face 1302a of a second lens 1302 can receive light beam 902 redirected by first output face 1300b of lens 1300. Second input face 1302a of lens 1302 can then redirect light beam 902 to project into lens 1302 in the direction of propagation axis 905. To achieve this, second input face 1302a of second lens 1302 can be tilted or angled at a non-zero angle with respect to fast axis 906 (i.e., second input face 1302a is non-parallel with fast axis 906). In a preferable implementation, the angle of first output face 1300b of lens 1300 with respect to fast axis 906 can be equal to the angle of second input face 1302a of lens 1302 with respect to fast axis 906 (i.e., second input face 1302a is parallel with first output face 1300b). In such an implementation, the redirection of light beam 902 caused by the first output face 1300b of lens 1300 will be reversed by the redirection of light beam 902 caused by second input face 1302a of lens 1302.

Subsequently, as shown in FIG. 13B, light beam 902 is collimated in the direction of slow axis 908 by a second output face 1302b of second lens 1302. This can be achieved by second output face 1302b having a convex shape with respect to slow axis 908. As shown in FIG. 13A, the second output face 1302b of second lens 1302 is shaped to not substantially influence light beam 902 in the direction of fast axis 906. This can be achieved by second output face 1302b having a straight shape with respect to fast axis 906 (i.e., second output face 1302b is parallel with fast axis 906).

As discussed above with reference to FIGS. 10A-10D and 11A-11D, by collimating light beam 902 with respect to fast axis 906 separately from slow axis 908, the collimation power applied to each axis can be independently controlled by controlling the power of lens 1300 and lens 1302 separately, that is, by separately controlling the optical power (e.g., curvature) of first input face 1300a of lens 1300 and second output face 1302b of lens 1302. Further, spacing between each of laser diode 900, first input face 1300a of lens 1300, and second output face 1302b of lens 1302 can be controlled to collimate light beam 902 to a desired width with respect to each axis separately. If light beam 902 is collimated with respect to fast axis 906 to the same width as slow axis 908, light beam 902 will be circularized. Because light beam 902 will typically diverge faster in the fast axis 906, it is generally preferable to collimate light beam 902 with respect to fast axis 906 first, then collimate light beam 902 with respect to slow axis 908 after. However, it is possible in certain applications to collimate light beam 902 with respect to slow axis 908 first, and subsequently collimate light beam 902 with respect to fast axis 906 after. This can be achieved by reversing the order of first lens 1300 with second lens 1302, with respect to the propagation axis 905, and mirroring the shapes of lens 1300 and lens 1302 in the direction of the propagation axis 905 (e.g., across fast axis 906 and slow axis 908).

Further, the amount of shift of light beam 902 can be increased by providing a larger spacing between first output face 1300b of lens 1300 and second input face 1302a of lens 1302, or decreased by providing a smaller spacing between first output face 1300b of lens 1300 and second input face 1302a of lens 1302. Alternatively or additionally, the amount of shift of light beam 902 can be increased by increasing the tilt angle of the first output face 1300b of lens 1300 and/or the tilt angle of second input face 1302a of lens 1302 with respect to the fast axis 906. Similarly, the amount of shift of light beam 902 can be decreased by decreasing the tilt angle of the first output face 1300b of lens 1300 and/or the tilt angle of second input face 1302a of lens 1302 with respect to the fast axis 906.

FIG. 13C is an isometric view which illustrates exemplary shapes for lenses 1300 and 1302. Each of first input face 1300a of lens 1300 and second output face 1302b of lens 1302 can be for example a partial-cylinder or arcuate. First input face 1300a of lens 1300 and second output face 1302b of lens 1302 can be similarly shaped, have similar curvature, or can have different shapes and/or different curvatures.

In the examples of FIGS. 13A-13C, first output face 1300b of lens 1300 and second input face 1302a of lens 1302 are shown as having a high degree of tilt with respect to fast axis 906. In practice, a tilt angle of less than a few degrees may be sufficient to achieve the desired beam shift. However, FIGS. 13A-13C are shown with a high tilt angle in order to more clearly demonstrate the features of the present invention. Further, although FIGS. 13A-13C illustrate an example of laterally shifting light beam 902 in the direction of fast axis 906, the light beam could also be laterally shifted in the direction of the slow axis 908 by tilting first output face 1300b and second input face 1302a at a non-zero angle with respect to slow axis 908 (i.e., first output face 1300b and second input face 1302a non-parallel with respect to slow axis 908). The light beam 902 could also be laterally shifted in the direction of both the fast axis 906 and the slow axis 908 by tilting both first output face 1300b and second input face 1302a at a non-zero angle with respect to both fast axis 906 and slow axis 908 (i.e., first output face 1300b and second input face 1302a non-parallel with respect to both fast axis 906 and slow axis 908).

Although FIG. 13A shows lens 1300 and lens 1302 as being spatially offset from each other in the direction of fast axis 906, this is not necessarily the case. Rather, lens 1300 and lens 1302 could be disposed evenly, for example by mounting lens 1300 and lens 1302 to a single planar base substrate.

Figure 14A:
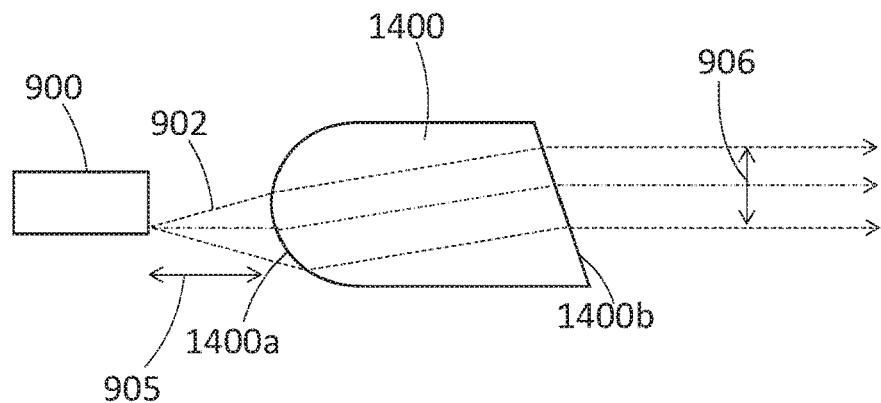
FIG. 14A is a left side sectional view of an optical system including a laser diode and a combined collimation and beam-shifting lens for circularizing, collimating, and shifting a beam of light.
Figure 14B:
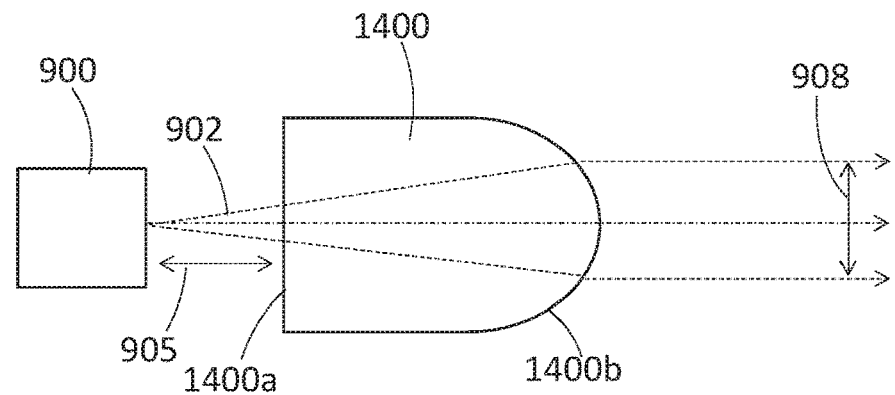
FIG. 14B is a top side sectional view of the optical system of FIG. 14B.
Figure 14C:
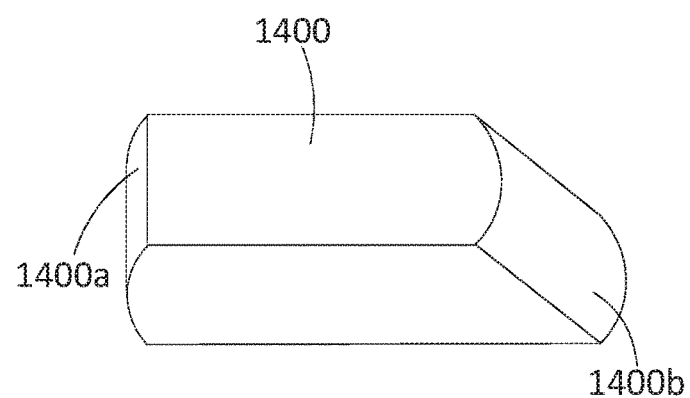
FIG. 14C is an isometric view of an exemplary lens shape which could be used in the implementation of FIGS. 14A and 14B.

FIGS. 14A-14C show another exemplary optical system that can be used to circularize and collimate an elliptical beam such as that shown in FIG. 9, as well as shift the trajectory of the beam. FIG. 14A illustrates an orthogonal view of the fast axis 906 of light beam 902 emitted from laser diode 900. FIG. 14B illustrates an orthogonal view of the slow axis 908 of light beam 902 emitted from laser diode 900. Propagation axis 905 lies generally in the direction of propagation of beam of light 902. As shown in FIG. 14A, an input face 1400a of lens 1400 collimates light beam 902 with respect to fast axis 906. To achieve this, input face 1400a of lens 1400 can have a convex shape with respect to fast axis 906. Additionally, light beam 902 can be received by input face 1400a offset in the direction of fast axis 906 from the center of lens 1400, as shown in FIG. 14A. This will redirect light beam 902 to travel at a non-zero angle with respect to propagation axis 905 as viewed from the perspective of FIG. 14A. As shown in FIG. 14B, the input face 1400a of lens 1400 is shaped to not substantially influence light beam 902 in the direction of slow axis 908. To achieve this, input face 1400a can have a straight shape with respect to slow axis 908 (i.e., input face 1400a is parallel with slow axis 908). Consequently, input face 1400a can have a partially cylindrical or arcuate shape, where the length of the partial cylinder extends parallel to the slow axis 908 of light beam 902. Stated differently, the curvature of the partial cylinder can curve around an axis of curvature that is parallel to slow axis 908.

Subsequently, an output face 1400b of lens 1400 can receive light beam 902 redirected by input face 1400a of lens 1400. Output face 1400b can then redirect light beam 902 to project out of lens 1400 in the direction of propagation axis 905. To achieve this, output face 1400b of lens 1400 can be tilted at a non-zero angle with respect to fast axis 906 (i.e., output face 1400b is non-parallel with fast axis 906). Preferably, the redirection of light beam 902 caused by the input face 1400a of lens 1400 will be reversed by the redirection of light beam 902 caused by output face 1400b of lens 1400. Additionally, as shown in FIG. 14B, light beam 902 is collimated in the direction of slow axis 908 by output face 1400b of lens 1400. This can be achieved by output face 1400b having a convex shape with respect to slow axis 908. As shown in FIG. 14A, output face 1400b of lens 1400 is shaped to not substantially collimate light beam 902 in the direction of fast axis 906. In view of the above, output face 1400b can have a partial cylindrical or arcuate shape, where the length of the partial cylinder lies in the direction of an axis which is tilted from fast axis 906 by a non-zero angle (i.e., output face 1400b is non-parallel with fast axis 906). Stated differently, the partially cylindrical shape curves around an axis of curvature tilted at a non-zero angle from the direction of fast axis 906. The precise non-zero angle can be determined according to the level of redirection of light beam 902 required or desired to redirect the light beam 902 received by output face 1400b to project in the direction of the propagation axis 905.

As discussed above with reference to FIGS. 10A-10D and 11A-11D, by collimating light beam 902 with respect to fast axis 906 separately from slow axis 908, the collimation power applied to each axis can be independently controlled by controlling the optical power (e.g., by controlling the curvature) of input face 1400a and output face 1400b of lens 1400. Further, spacing between each of laser diode 900, input face 1400a, and output face 1400b can be controlled to collimate light beam 902 to a desired width with respect to each axis separately. If light beam 902 is collimated with respect to fast axis 906 to the same width as slow axis 908, light beam 902 will be circularized. Because light beam 902 will typically diverge faster in the fast axis 906, it is generally preferable to collimate light beam 902 with respect to fast axis 906 first, then collimate light beam 902 with respect to slow axis 908 after. However, it is possible in certain applications to collimate light beam 902 with respect to slow axis 908 first, and subsequently collimate light beam 902 with respect to fast axis 906 after. This can be achieved by mirroring the shapes of lens 1400 in the direction of propagation axis 905 (e.g., across fast axis 906 and slow axis 908).

Further, the amount of shift of light beam 902 can be increased by providing a larger spacing between input face 1400a and output face 1400b of lens 1400, or decreased by providing a smaller spacing between input face 1400a and output face 1400b of lens 1400. Alternatively or additionally, the amount of shift of light beam 902 can be increased by increasing the offset from the center of lens 1400 in the direction of fast axis 906 at which light beam 902 impinges on input face 1400a, and/or increasing the tilt angle of output face 1400b of lens 1400 with respect to the fast axis 906. Similarly, the amount of shift of light beam 902 can be decreased by decreasing the offset from the center of lens 1400 in the direction of fast axis 906 at which light beam 902 impinges on input face 1400a, and/or decreasing the tilt angle of output face 1400b of lens 1400 with respect to the fast axis 906.

FIG. 14C is an isometric view which illustrates an exemplary shape for lens 1400. Each of input face 1400a and output face 1400b of lens 1400 can be for example a partial-cylinder. Input face 1400a and output face 1400b of lens 1400 can be similarly shaped, have similar curvatures, or can have different shapes or different curvatures.

In the examples of FIGS. 14A-14C, output face 1400b of lens 1400 is shown as having a high degree of tilt with respect to fast axis 906. In practice, a tilt angle of less than a few degrees may be sufficient to achieve the desired beam shift. However, FIGS. 14A-14C are shown with a high tilt angle in order to more clearly demonstrate the features of the present invention. Further, although FIGS. 14A-14C illustrate an example of laterally shifting light beam 902 in the direction of fast axis 906, the light beam could also be laterally shifted in the direction of the slow axis 908 by tilting output face 1400b at a non-zero angle with respect to slow axis 908, and by providing input face 1400a with a convex curvature with respect to slow axis 908. The light beam 902 could also be laterally shifted in the direction of both the fast axis 906 and the slow axis 908 by tilting output face 1400b at a non-zero angle (i.e., non-parallel) with respect to both fast axis 906 and slow axis 908, and by providing input face 1400a with a convex curvature with respect to both fast axis 906 and slow axis 908. Such an arrangement would result in some degree of focusing to occur at input face 1400a with respect to both the fast axis 906 and slow axis 908, and consequently the optical power (e.g. curvature) of output face 1400b should be reduced accordingly to compensate.

A combined collimation and beam-shifting optical system such as those described with reference to FIGS. 13A-13C and 14A-14C could be provided for any number of the laser diodes shown in FIGS. 12A and 12B. For example, the output from only a single laser diode could be received by a combined collimation and beam-shifting optical system. As another example, the output from each of the laser diodes in a system could be received by one or a plurality of combined collimation and beam-shifting optical systems. For example a single combined collimation and beam shifting optical system could receive the output light beam from each of the laser diodes. Alternatively, a plurality of combined collimation and beam-shifting optical systems could be provided, and each combined collimation and beam-shifting optical system could receive an output light beam from a respective laser diode.

In the example of FIG. 12A, a single combination collimation and beam-shifting optical system could be provided which receives light beams output by each of laser diodes 1210a and 1210b, and shifts the received light beams to be in the same plane as light beams output by laser diodes 1210c and 1210d. Output light beams from laser diodes 1210c and 1210d could be received by collimation optics which do not perform any beam shifting. A similar effect could be achieved by providing a collimation and beam-shifting optical system for laser diode 1210a, and a separate collimation and beam-shifting optical system for laser diode 1210b. Such an arrangement could advantageously allow each combined collimation and beam-shifting optical system to be tuned for the specific wavelength of light emitted by the respective laser diode, thus improving accuracy. Alternatively, one or more combined collimation and beam-shifting optical systems can be provided which receive output beams of light from laser diodes 1210c and 1210d, and shift the received beams of light to be in the same plane as beams of light from laser diodes 1210a and 1210b. This could include providing a single combined collimation and beam-shifting optical system, or an individual combined collimation and beam-shifting optical system for each of laser diodes 1210c and 1210d.

As a further alternative, each of laser diodes 1210a, 1210b, 1210c, and 1210d could output a beam of light into a respective combined collimation and beam-shifting optical system, and each of the combined collimation and beam-shifting optical systems could be arranged to shift the respective beam of light such that all of the beams of light are in a common plane, offset from all of the output facets 1211a, 1211b, 1211c, and 1211d.

Further, even in an exemplary system like that of FIG. 12B where all of the output facets 1211a, 1211b, 1211c, and 1211d are aligned in a common plane, at least one combined collimation and beam-shifting optical system can be provided, to shift all of the output beams of light to be in a different plane.

A person of skill in the art will appreciate that the teachings of the present systems, methods, and devices may be modified and/or applied in additional applications beyond the specific WHUD implementations described herein. In some implementations, one or more optical fiber(s) may be used to guide light signals along some of the paths illustrated herein.

The WHUDs described herein may include one or more sensor(s) (e.g., microphone, camera, thermometer, compass, altimeter, and/or others) for collecting data from the user's environment. For example, one or more camera(s) may be used to provide feedback to the processor of the WHUD and influence where on the display(s) any given image should be displayed.

The WHUDs described herein may include one or more on-board power sources (e.g., one or more battery(ies)), a wireless transceiver for sending/receiving wireless communications, and/or a tethered connector port for coupling to a computer and/or charging the one or more on-board power source(s).

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other portable and/or wearable electronic devices, not necessarily the exemplary wearable electronic devices generally described above.

For instance, the foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more computer programs executed by one or more computers (e.g., as one or more programs running on one or more computer systems), as one or more programs executed by on one or more controllers (e.g., microcontrollers) as one or more programs executed by one or more processors (e.g., microprocessors, central processing units, graphical processing units), as firmware, or as virtually any combination thereof, and that designing the circuitry and/or writing the code for the software and or firmware would be well within the skill of one of ordinary skill in the art in light of the teachings of this disclosure.

When logic is implemented as software and stored in memory, logic or information can be stored on any processor-readable medium for use by or in connection with any processor-related system or method. In the context of this disclosure, a memory is a processor-readable medium that is an electronic, magnetic, optical, or other physical device or means that contains or stores a computer and/or processor program. Logic and/or the information can be embodied in any processor-readable medium for use by or in connection with an instruction execution system, apparatus, or device, such as a computer-based system, processor-containing system, or other system that can fetch the instructions from the instruction execution system, apparatus, or device and execute the instructions associated with logic and/or information.

In the context of this specification, a "non-transitory processor-readable medium" can be any element that can store the program associated with logic and/or information for use by or in connection with the instruction execution system, apparatus, and/or device. The processor-readable medium can be, for example, but is not limited to, an electronic, magnetic, optical, electromagnetic, infrared, or semiconductor system, apparatus or device. More specific examples (a non-exhaustive list) of the computer readable medium would include the following: a portable computer diskette (magnetic, compact flash card, secure digital, or the like), a random access memory (RAM), a read-only memory (ROM), an erasable programmable read-only memory (EPROM, EEPROM, or Flash memory), a portable compact disc read-only memory (CDROM), digital tape, and other non-transitory media.

The various embodiments described above can be combined to provide further embodiments. To the extent that they are not inconsistent with the specific teachings and definitions herein, at least the following are incorporated herein by reference in their entirety: U.S. Provisional Patent Application Ser. No. 62/438,725, U.S. Non-Provisional patent application Ser. No. 15/848,265 (U.S. Publication Number 2018/0180885), U.S. Non-Provisional patent application Ser. No. 15/848,388 (U.S. Publication Number 2018/0180886), U.S. Provisional Patent Application Ser. No. 62/450,218, U.S. Non-Provisional patent application Ser. No. 15/852,188 (U.S. Publication Number 2018/0210215), U.S. Non-Provisional patent application Ser. No. 15/852,282, (U.S. Publication Number 2018/0210213), U.S. Non-Provisional patent application Ser. No. 15/852,205 (U.S. Publication Number 2018/0210216), U.S. Provisional Patent Application Ser. No. 62/575,677, U.S. Provisional Patent Application Ser. No. 62/591,550, U.S. Provisional Patent Application Ser. No. 62/597,294, U.S. Provisional Patent Application Ser. No. 62/608,749, U.S. Provisional Patent Application Ser. No. 62/609,870, U.S. Provisional Patent Application Ser. No. 62/591,030, U.S. Provisional Patent Application Ser. No. 62/620,600, U.S. Provisional Patent Application Ser. No. 62/576,962, U.S. Provisional Patent Application Ser. No. 62/760,835, U.S. Non-Provisional patent application Ser. No. 16/201,664, U.S. Non-Provisional patent application Ser. No. 16/168,690, U.S. Non-Provisional patent application Ser. No. 16/171,206, U.S. Non-Provisional patent application Ser. No. 16/203,221, U.S. Non-Provisional patent application Ser. No. 16/216,899, U.S. Non-Provisional patent application Ser. No. 16/231,019, U.S. Non-Provisional patent application Ser. No. 16/231,325. and/or PCT Patent Application PCT/CA2018051344. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A wearable heads-up display (WHUD), comprising:
an optical engine, comprising:
  a laser diode; and
  at least one temperature sensor configured to generate temperature sensor data indicative of a temperature of the laser diode;
at least one scan mirror positioned to receive light output by the laser diode; and
at least one processor configured to:
  determine, based on the temperature sensor data, whether the temperature of the laser diode is below an operating temperature range; and
  in response to determining that the temperature of the laser diode is below the operating temperature range:
    cause the scan mirror to move to or remain in an out-of-view position where light emitted by the laser diode is redirected by the scan mirror to a position outside of an eyebox of the WHUD; and
    cause the laser diode to emit light while the scan mirror is positioned in the out-of-view position.

2. The WHUD of claim 1, wherein, in response to determining that the temperature of the laser diode is below the operating temperature range, the at least one processor is configured to cause the laser diode to emit light until the at least one processor determines that the temperature of the laser diode has reached a threshold temperature value within the operating temperature range.

3. The WHUD of claim 2, wherein the threshold temperature value is equal to an upper end of the operating temperature range.

4. The WHUD of claim 2, wherein the threshold temperature value is below an upper end of the operating temperature range.

5. The WHUD of claim 2, wherein, in response to determining that the temperature of the laser diode is below the operating temperature range, the at least one processor is configured to alternatingly cause the laser diode to emit light while the scan mirror is positioned in the out-of-view position and while the scan mirror is positioned in an in-view position where light emitted by the laser diode is configured to be redirected by the scan mirror to a position within the eyebox.

6. The WHUD of claim 1, wherein the optical engine comprises a plurality of laser diodes, and wherein the at least one processor is configured to:
in response to determining that the temperature of at least one of the plurality of laser diodes is below the operating temperature range:
  cause the scan mirror to move to or remain in the out-of-view position; and
  cause the at least one of the plurality of laser diodes to emit light while the scan mirror is positioned in the out-of-view position.

7. The WHUD of claim 6, wherein the at least one temperature sensor comprises a plurality of temperature sensors, and wherein each of the plurality of temperature sensors is associated with a respective one of the plurality of laser diodes.

8. The WHUD of claim 1, wherein the operating temperature range is between 50° C. and 70° C.

9. A method comprising:
receiving, by at least one processor of a wearable heads-up display (WHUD), temperature sensor data from at least one temperature sensor;
determining, by the at least one processor based on the temperature sensor data, whether a temperature of a laser diode is below an operating temperature range; and
in response to determining that the temperature of the laser diode is below the operating temperature range,
causing, by the at least one processor, a scan mirror to move to an out-of-view position where light emitted by the laser diode is redirected by the scan mirror to a position outside of an eyebox of the WHUD; and
causing, by the at least one processor, the laser diode to emit light while the scan mirror is positioned in the out-of-view position.

10. The method of claim 9, further comprising, in response to determining that the temperature of the laser diode has reached a threshold temperature value, causing the scan mirror to move to an in-view position where the light emitted by the laser diode is redirected to a position within the eyebox of the WHUD.

11. The method of claim 9, wherein causing the laser diode to emit light comprises instructing a laser diode driver circuit corresponding to the laser diode to drive current to the laser diode.

12. The method of claim 11, wherein the laser diode driver circuit is a constant current driver, a constant voltage driver, a pulsing driver, a low power driver, or a high power driver.

* * * * *